(12) United States Patent
Gossner et al.

(10) Patent No.: US 7,638,370 B2
(45) Date of Patent: Dec. 29, 2009

(54) METHOD FOR PRODUCING MULTI-GATE FIELD-EFFECT TRANSISTOR WITH FIN STRUCTURE HAVING DRAIN-EXTENDED MOS FIELD-EFFECT TRANSISTOR

(75) Inventors: Harald Gossner, Riemerling (DE);
Thomas Schulz, Heverlee (BE);
Christian Russ, Dierdorf (DE);
Gerhard Knoblinger, Villach (AT)

(73) Assignee: Infineon Technologies AG, Neubibery (DE)

( * ) Notice: Subject to any disclaimer, the term of this patent is extended or adjusted under 35 U.S.C. 154(b) by 0 days.

(21) Appl. No.: 11/800,984

(22) Filed: May 8, 2007

(65) Prior Publication Data

US 2008/0067587 A1 Mar. 20, 2008

(30) Foreign Application Priority Data

May 11, 2006 (DE) .................. 10 2006 022 126

(51) Int. Cl.
*H01L 29/78* (2006.01)
*H01L 21/332* (2006.01)

(52) U.S. Cl. .................. 438/135; 438/157; 257/336; 257/E21.437; 257/E21.389; 257/E29.261

(58) Field of Classification Search .............. 257/336, 257/E21.437, E21.389, E29.261, 124, 175; 438/135, 157; 361/100, 205; 363/27, 54, 363/57, 85, 128
See application file for complete search history.

(56) References Cited

U.S. PATENT DOCUMENTS

| | | | |
|---|---|---|---|
| 6,025,237 A | 2/2000 | Choi | |
| 6,720,619 B1 | 4/2004 | Chen et al. | |
| 6,828,202 B1 | 12/2004 | Horch | |
| 6,965,129 B1 | 11/2005 | Horch et al. | |
| 2004/0217433 A1 | 11/2004 | Yeo et al. | |
| 2006/0273372 A1* | 12/2006 | Voldman et al. | ............ 257/308 |
| 2007/0012945 A1* | 1/2007 | Sugizaki | .................... 257/124 |

FOREIGN PATENT DOCUMENTS

DE 101 37 343 C1 7/2001

OTHER PUBLICATIONS

Jozef C. Mitros et al., "*High-Voltage Drain Extended MOS Transistors for 0.18-μm Logic CMOS Process*", IEEE Transactions on Electron Devices, vol. 48, No. 8, Aug. 2001, pp. 1751-1755.

(Continued)

*Primary Examiner*—Matthew Smith
*Assistant Examiner*—Walter H Swanson
(74) *Attorney, Agent, or Firm*—Brinks Hofer Gilson & Lione

(57) ABSTRACT

In a method for producing an electronic component, a first doped connection region and a second doped connection region are formed on or above a substrate; a body region is formed between the first doped connection region and the second doped connection region; at least two gate regions separate from one another are formed on or above the body region; at least one partial region of the body region is doped by means of introducing dopant atoms, wherein the dopant atoms are introduced into the at least one partial region of the body region through at least one intermediate region formed between the at least two separate gate regions.

16 Claims, 15 Drawing Sheets

OTHER PUBLICATIONS

Oliver Marichal, et al., "*SCR based ESD protection in nanometer SOI technologies*", Sarnoff Europe, Brugse Baan 188A, B-8470 Gistel, Belgium, pp. 2-9, 2005 EOS/ESD Symposium.

Ajith Amerasekera et al., "*Physics and Operation of ESD Protection Circuit Elements*", pp. 68-104, Copy right 2002, John Wiley & Sons, Ltd.

* cited by examiner

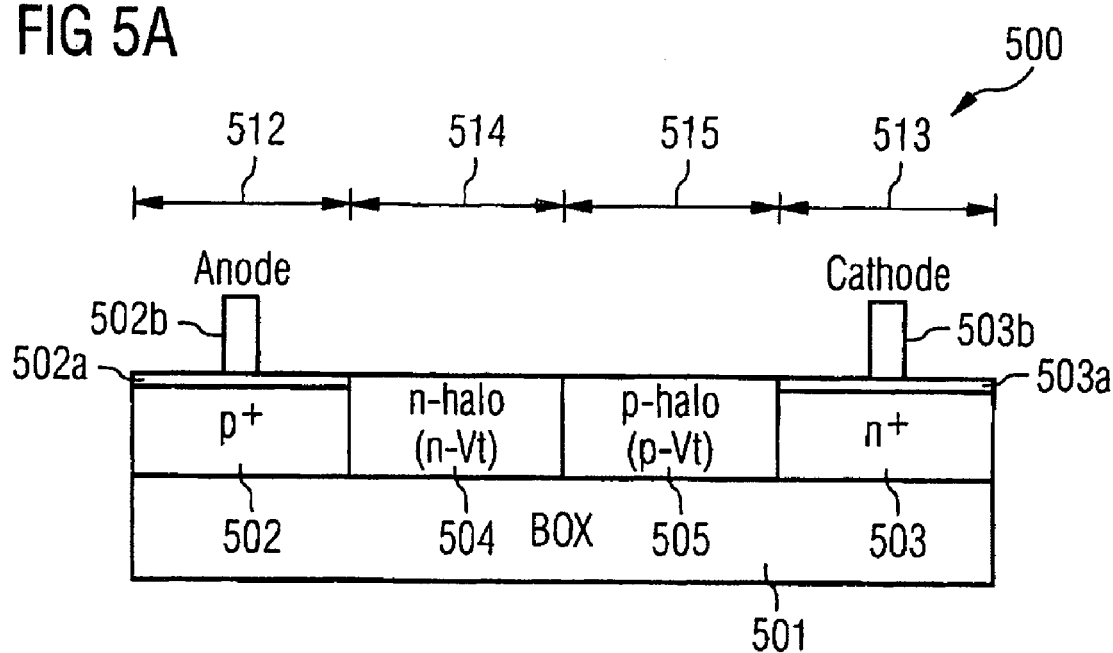
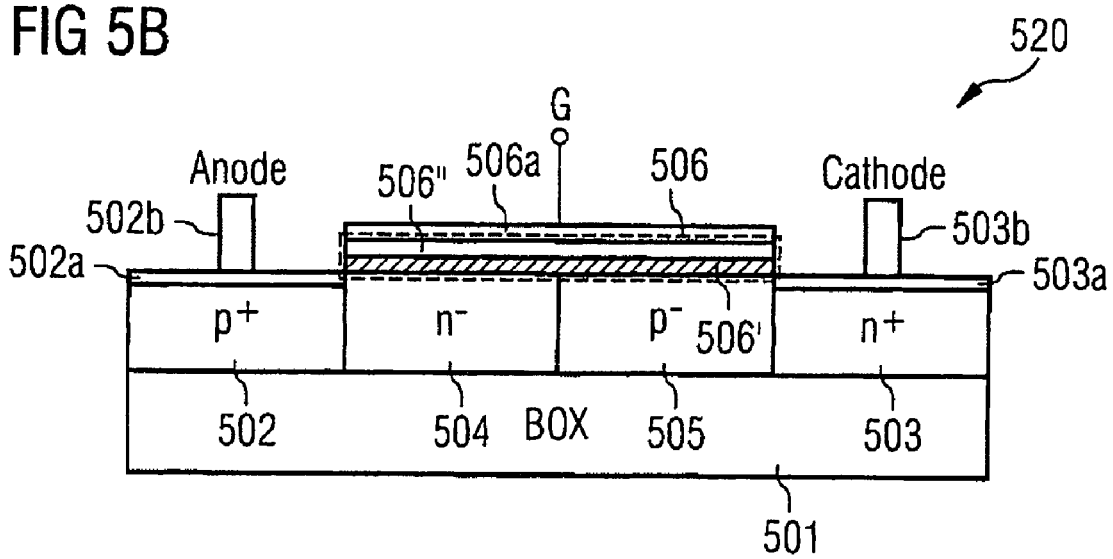

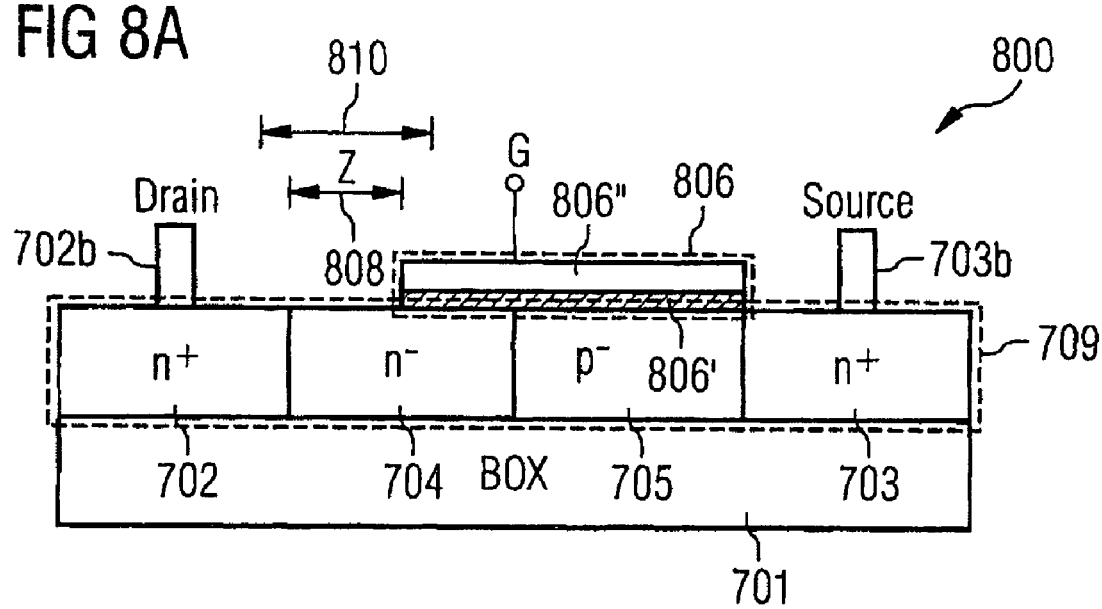
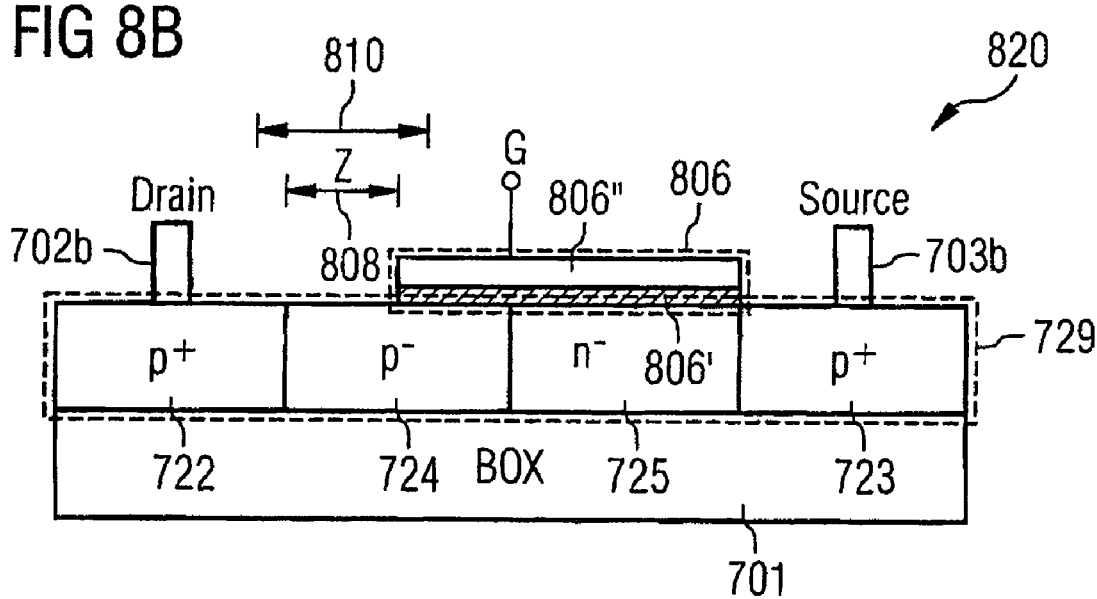

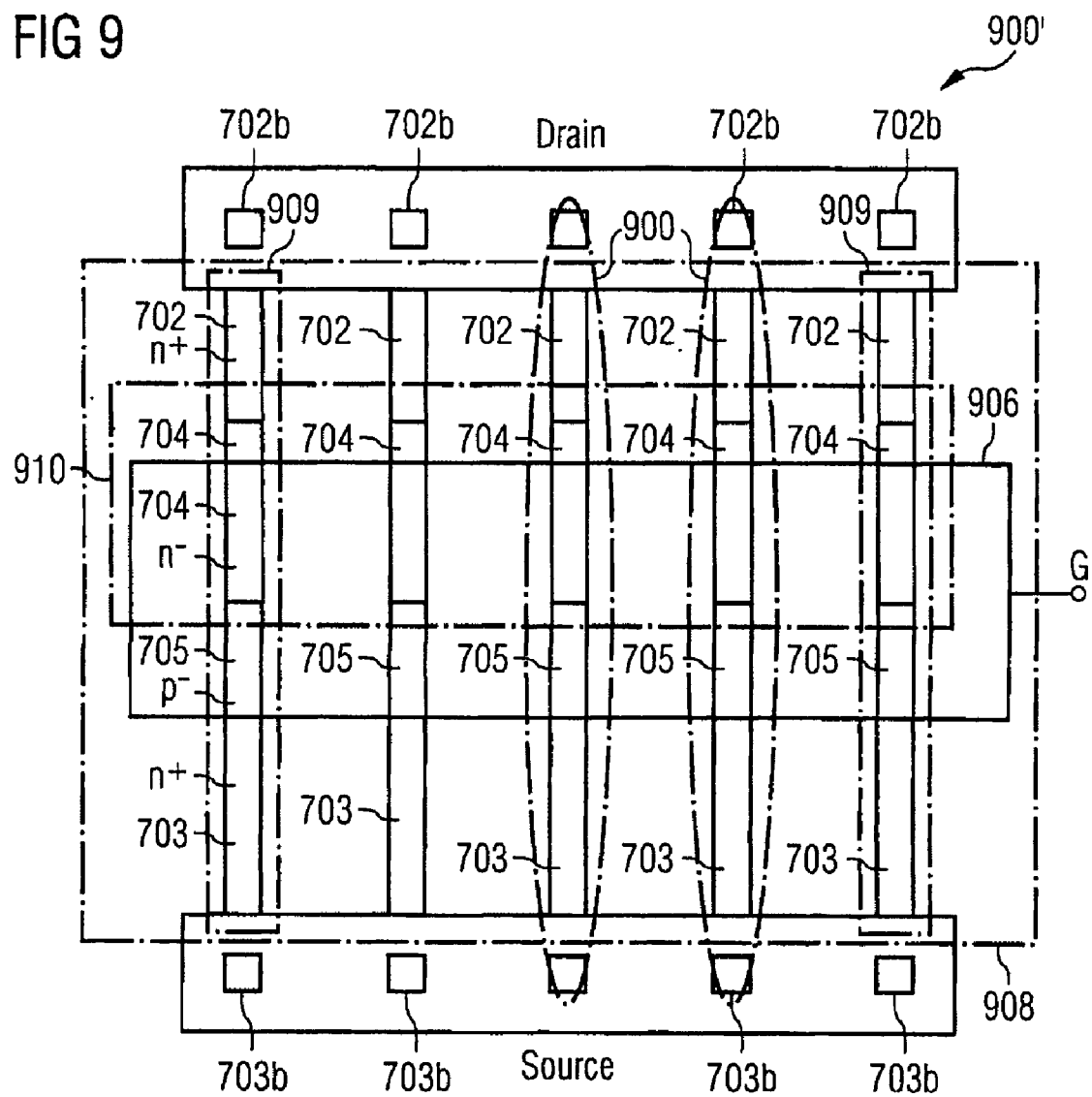

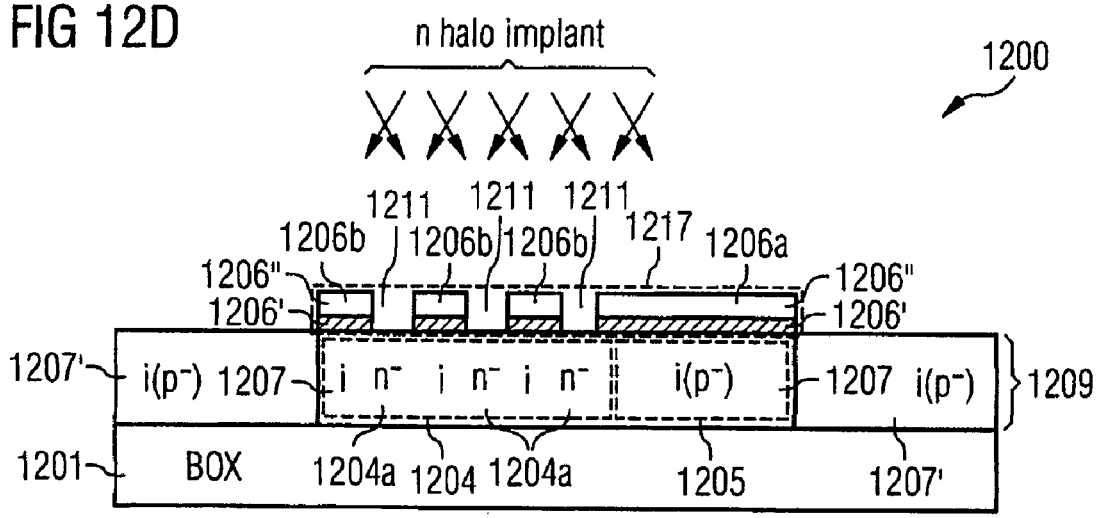
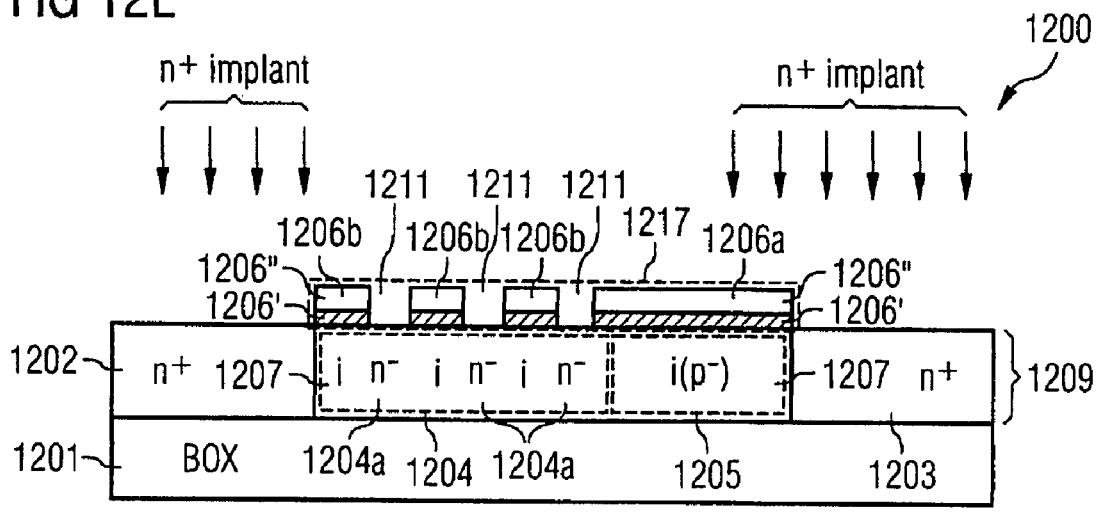

though in practice this is not strictly necessary. The actual operation region of the component is located between the two highly doped contact regions. A conventional thyristor is shown in FIG. 1.

METHOD FOR PRODUCING MULTI-GATE FIELD-EFFECT TRANSISTOR WITH FIN STRUCTURE HAVING DRAIN-EXTENDED MOS FIELD-EFFECT TRANSISTOR

RELATED APPLICATIONS

The present application claims priority to German Patent Application No 10 2006 022 126.5-33, filed May 11, 2006, the entirety of which is hereby incorporated by reference.

BACKGROUND

The invention relates to a method for producing an electronic component, a method for producing a thyristor, a method for producing a drain-extended MOS field-effect transistor, an electronic component, a drain-extended MOS field-effect transistor, and also an electronic component arrangement.

It is desirable to provide ESD protection elements for advanced process technologies such as, for example, FD-SOI technologies or FinFET or MuGFET technologies.

BRIEF DESCRIPTION OF THE DRAWINGS

In the drawings, identical reference symbols generally designate the same constituent parts throughout the various views. The drawings are not necessarily true to scale. The main emphasis is instead generally put on illustrating the principles of the invention. In the description below, various exemplary embodiments of the invention are described with reference to the following drawings, in which:

FIG. 5A shows a thyristor produced by means of a method for producing a thyristor in accordance with a first exemplary embodiment of the invention;

FIG. 5B shows a thyristor produced by means of a method for producing a thyristor in accordance with a second exemplary embodiment of the invention;

FIG. 8A shows a drain-extended MOS field-effect transistor in accordance with a ninth exemplary embodiment of the invention;

FIG. 8B shows a drain-extended MOS field-effect transistor in accordance with a tenth exemplary embodiment of the invention;

FIG. 9 shows a layout illustration of an electronic component arrangement in accordance with an eleventh exemplary embodiment of the invention;

FIGS. 12A to 12F show various process steps of a method for producing an electronic component in accordance with a fourteenth exemplary embodiment of the invention;

DESCRIPTION

Electrostatic discharges (ESD) constitute a permanent threat to integrated circuits (IC). An ESD event involves the occurrence of a short electrical discharge pulse, triggered by a large electrical voltage difference, during which pulse an electric current can flow with a high current intensity, for example, via a normally electrically insulating material (e.g. a gate oxide of a field-effect transistor), and can thereby cause damage to an electronic component of the IC. Protection against electrostatic discharges or ESD events is therefore desirable for all electronic components of a circuit.

Particularly with the use of advanced process technologies such as e.g. FDSOI technologies (FDSOI: Fully Depleted Silicon on Insulator=silicon-on-insulator structure fully depleted of charge carriers) or FinFET technologies (FinFET: Fin Field Effect Transistor=field-effect transistor having a fin structure) or MuGFET technologies (MuGFET: Multi-Gate Field Effect Transistor=field-effect transistor having a fin structure in which a channel region is driven from at least three sides with the aid of a gate), the development of efficient ESD protection mechanisms constitutes a growing challenge in view of the ever shrinking dimensions of the electronic components and the associated increasing sensitivity towards electrical overvoltages.

In order to protect an integrated circuit against damage caused by electrostatic discharges, ESD protection elements may be installed at each input/output connection (I/O pad) and at each supply connection (supply pad) of the IC. These protection mechanisms preferably turn on when a discharge occurs, and should effectively limit the voltage overshoot, that is to say the overshooting of a critical voltage value. At the same time, the protection mechanisms should not be damaged by the discharge, which forces electric currents having a current intensity of several amperes through the I/O devices and the protection elements.

One known efficient protection element is a thyristor (Silicon Controlled Rectifier, SCR). It comprises an $n^+$-type contact region and a $p^+$-type contact region and also two mutually adjoining lightly doped regions having different conductivity types (i.e. a weakly p-doped region and a weakly n-doped region) in between, which are arranged in such a way that a pnpn four-layer structure with three pn junctions results.

Figure 1:
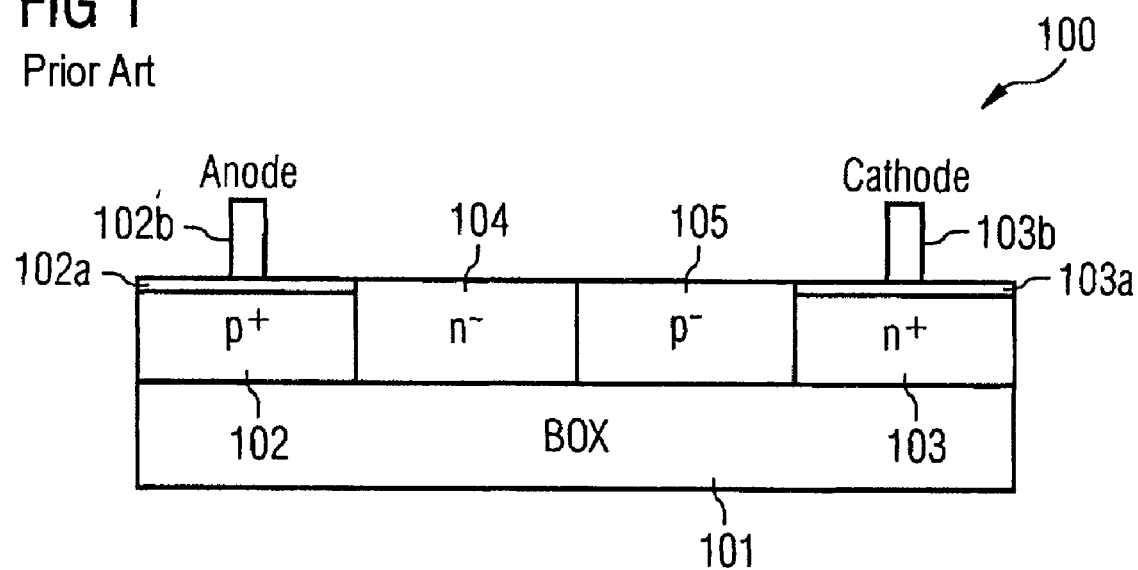
FIG. 1 shows a conventional thyristor.

FIG. 1 shows as an example of a schematic cross-sectional view of a conventional SCR 100, realized in an SOI technology. A heavily p-doped (P+) first contact region 102 and a heavily n-doped (N+) second contact region 103 are formed on a buried oxide layer (Buried Oxide, BOX) 101 of the SCR 100. A first silicide layer 102a is formed on the first contact region 102, contact being made with said first silicide layer by means of a first electrical contact 102b. A second silicide layer 103a is formed on the second contact region 103, electrical contact being made with said second silicide layer by means of a second electrical contact 103b. The first contact region 102, the first silicide layer 102a formed thereon and the first electrical contact 102b form an anode (identified by "Anode" in FIG. 1) of the SCR 100, while the second contact region 103, the second silicide layer 103a formed thereon and the second electrical contact 103b form a cathode of the SCR 100 (identified by "Cathode" in FIG. 1). A weakly n-doped (N−) first body region 104 and a weakly p-doped (P−) second body region 105 are formed between the first contact region 102 and the second contact region 103.

Clearly the SCR 100 can be interpreted as two laterally arranged, mutually interlaced bipolar transistors of different types, that is to say as a pnp transistor (formed from the first contact region 102 (P+), the first body region 104 (N−) and the second body region 105 (P−)) and an npn transistor (formed from the first body region 104 (N−), the second body region 105 (P−) and the second contact region 103 (N+)), wherein the collector of the pnp transistor forms the base of the npn transistor, and vice versa.

One problem in producing an SCR such as the SCR 100 shown in FIG. 1 consists in realizing the two lightly doped body regions 104 (N−) and 105 (P−) between the two highly doped contact regions 102 (P+) and 103 (N+) of the SCR.

In conventional bulk CMOS technologies (CMOS: Complementary Metal Oxide Semiconductor), so-called well implantations or well implants (e.g. Nwell implants and/or Pwell implants) are used in order to form the lightly doped base regions of an SCR, while in conventional PDSOI technologies (PDSOI: Partially Depleted Silicon on Insulator=silicon-on-insulator structure partially depleted of charge carriers), so-called threshold voltage implantations or Vt implants are used for forming the lightly doped body regions.

Conventional methods (e.g. in a PDSOI technology) for realizing a lateral SCR are based on the fact that during the formation of the highly doped (P+ and N+) contact regions (e.g. by ion implantation), the P+doping and N+ doping is blocked in the regions in which an n-type well doping (N−) and a p-type well doping (P−) are respectively desired (in other words in the regions which are intended to serve as weakly doped body regions of the SCR) and that, moreover, a siliciding is blocked over the body regions in order to avoid short circuits between the highly doped contact regions.

The methods described above have the following disadvantages:

1) The blocking of the siliciding requires a special mask (silicide blocking mask) which is not available, under certain circumstances, in a standard FDSOI process or a standard MuGFET process.

2) In order to define the distance between the highly doped electrode regions and the n-type well region (N−) and p-type well region (P−), it is necessary to use non-self-aligning process steps, which can lead to a greater variation of the trigger voltage of an SCR and/or to the occurrence of leakage currents in the SCR.

3) If—as is planned for a MuGFET process—neither an n-type well implantation (or p-type well implantation) nor a corresponding threshold voltage implantation (Vt implantation) is available in the process flow, then the method described above for forming the lightly doped body regions cannot be carried out from the outset.

In a MuGFET process, a well implantation or a Vt implantation generally has the effect that the doping atoms are distributed statistically within the individual transistor finger structures, each individual transistor finger having only a few doping atoms. On account of the statistical distribution of this extremely small number of doping atoms, a MOSFET device produced in this way in a MuGFET technology would often have fluctuations of the threshold voltage Vt, of the "on" current $I_{on}$ and of the "off" current $I_{off}$. Dispensing with a well implantation is therefore based on the idea of reducing said fluctuations.

Intrinsic silicon material is used for the body regions of the NFET and of the PFET. In this case, the threshold voltages of the NFET and of the PFET have to be adapted by means of suitable gate materials.

It is expected that multi-gate FET devices (MuGFET) or FinFET devices will be used in the future on account of the limited scalability of conventional bulk CMOS technologies. Said FinFET devices are usually designed for high-speed logic core applications, which applications are distinguished by low supply voltages (e.g. 0.8 V to 1.2 V). In order to keep the process complexity low, devices are needed for the customarily higher I/O supply voltages (e.g. 1.5 V to 2.5 V and higher), which devices do not require any additional process steps during production.

Figure 2:
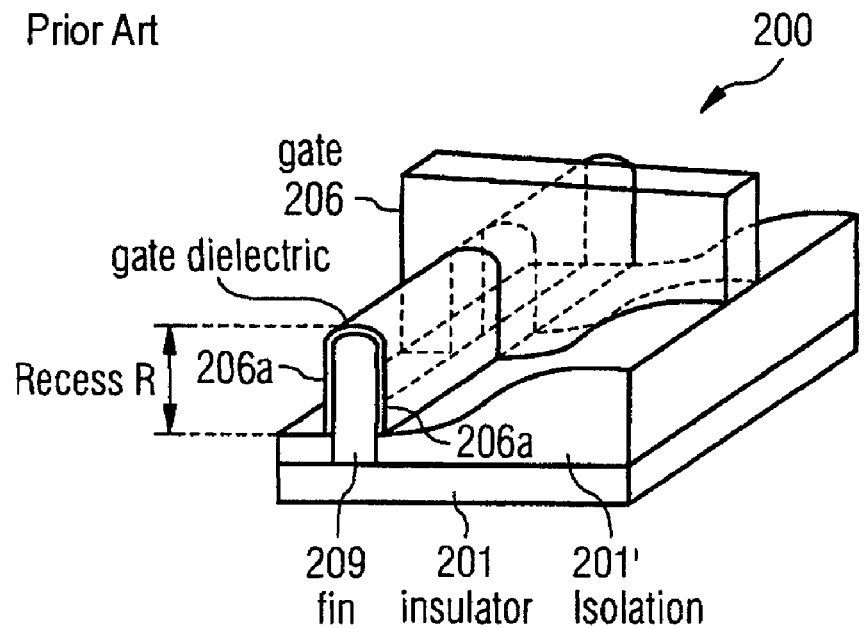
FIG. 2 shows a conventional fin field-effect transistor.

FIG. 2 shows a conventional FinFET structure 200. The FinFET 200 has a fin structure (fin) 209 formed on a first electrically insulating layer 201 above a substrate (not shown). A second insulating layer 201' is formed on the first insulating layer 201, the fin 209 being surrounded by the second insulating layer 201' or being partially embedded into the second insulating layer 201'. A gate dielectric 206a is formed on the fin 209, and a gate 206 is formed on a partial region of the gate dielectric 206a and also on a partial region of the second insulating layer 201'.

However, the FinFET device 200 proposed is not suitable for high I/O supply voltages since:

(i) the body of the FinFET 200 is potential-free (floating body)

(ii) the FinFET 200 has a high leakage current in the "off" state (iii) the FinFET 200 has a gate-induced drain leakage current, and (iv) the FinFET 200 is sensitive to the generation of hot charge carriers (hot carrier generation).

Figure 3:
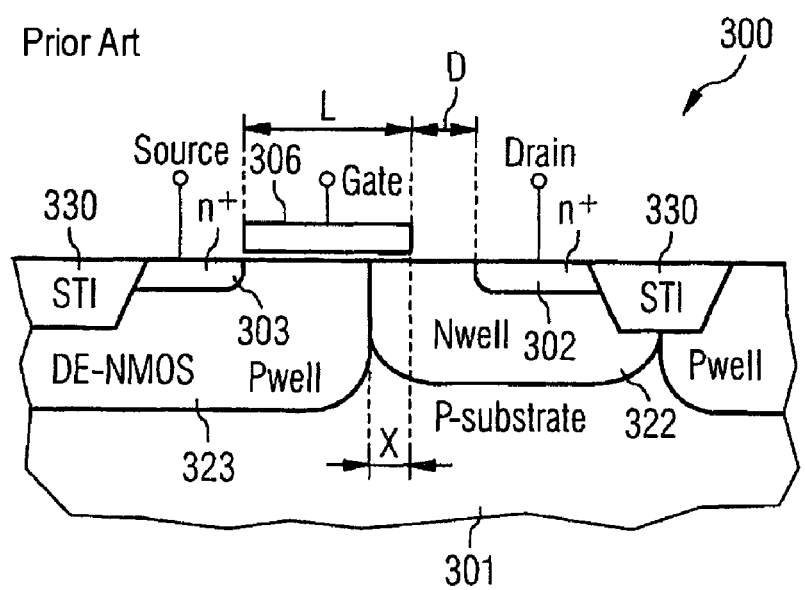
FIG. 3 shows a conventional drain-extended NMOS field-effect transistor.

FIG. 3 shows a conventional drain-extended NMOS (DE-NMOS) field-effect transistor 300 (i.e. an N-channel MOSFET with an extended drain region) for conventional CMOS bulk technologies. The DE-NMOS field-effect transistor 300 has an N-type well region 322 (Nwell) formed in a p-doped substrate 301 (P-substrate), and also a P-type well region 323 (Pwell) formed in the substrate 301, wherein the N-type well region 322 and the P-type well region 323 are mask-aligned and are doped by means of ion implantation. An N+-doped drain region 302 is formed in the N-type well region 322, and an N+-doped source region 303 is formed in the P-type well region 323. A gate 306 is formed above a partial region of the P-type well region 323 and above a partial region of the N-type well region 322. The DE-NMOS transistor 300 is electrically insulated laterally by means of trench isolation regions 330 (Shallow Trench Isolation, STI). The actual MOS channel length of the DE-NMOS field-effect transistor 300 is determined by the printed gate length minus the overlap X into the N-type well region 322.

In CMOS bulk technologies it is necessary for the N-type well region 322 and the P-type well region 323 to reach down comparatively deep (depth approximately 1 µm to 2 µm). These technologies have a significant vertical and lateral out-diffusion of the doping atoms and hence the position of the pn junctions. Therefore, one problem in the case of a DE-MOS device generally consists in precisely controlling or defining the electrically effective gate length (i.e. the significant design parameter) of the device.

The motivation for using a DE-MOS device such as the one shown in FIG. 3 is its suitability for higher supply voltages. This is achieved by means of the N-type well region 322, which reaches as far as below the gate electrode 306 and therefore forms an extended drain region, to put it another way a drain extension, of the transistor 300. On account of the lower dopant concentration of the N-type well region 322 compared with the standard N+ drain doping, the electric field is lower in the drain region of the transistor 300. As a consequence of this, it is possible to use a higher drain voltage without the problem of generation of hot charge carriers occurring.

One disadvantage of a DE-MOS field-effect transistor device generally consists in the fact that a DE-MOS-FET has a lower "on" current and a higher "on" resistance. In addition, the DE-MOS structure 300 shown in FIG. 3 is not compatible with an SOI technology or MuGFET technology.

Figure 4:
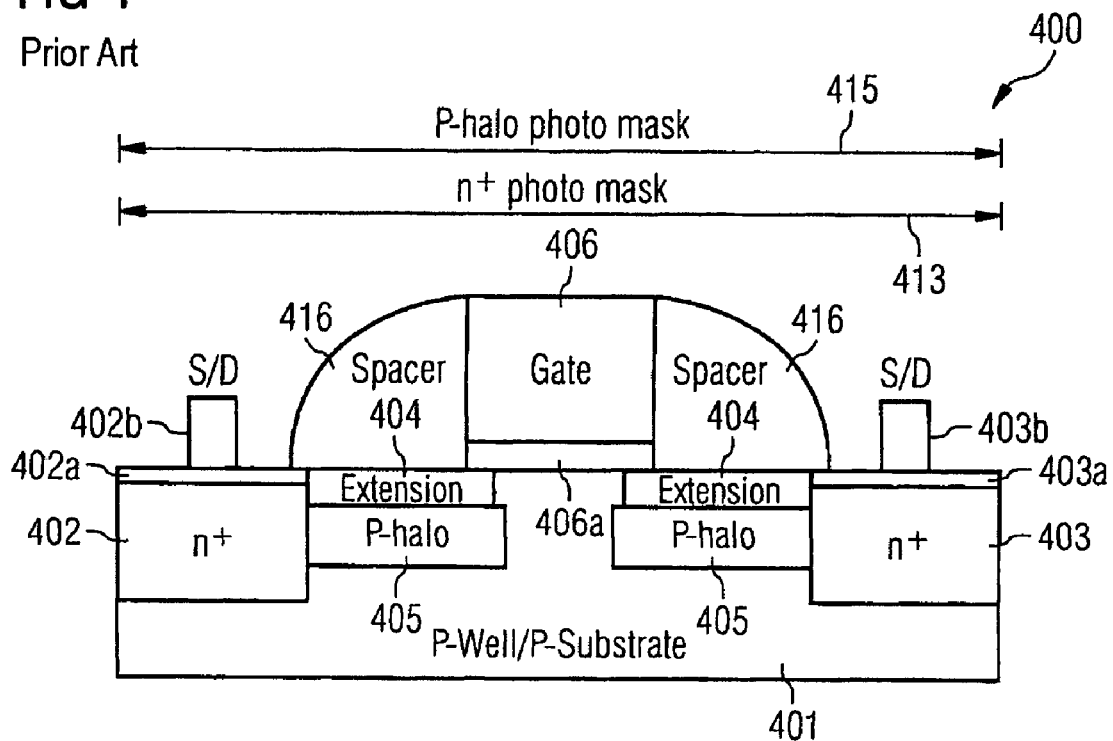
FIG. 4 shows a conventional MOS field-effect transistor.

FIG. 4 shows a conventional MOS field-effect transistor (MOS-FET) 400 produced in a bulk technology and including a p-doped substrate 401 or a P-type well region 401 and also a first N+-doped source/drain region 402 formed in the P-type substrate/P-type well region 401 and a second N+-doped source/drain region 403 formed in the P-type substrate P-type well region 401. The N+-doping of the source/drain regions 402 and 403 is effected using an N+-type photomask 413, the contour of which is illustrated in FIG. 4. A first silicide layer 402a is formed on the first source/drain region 402, electrical contact being made with said first silicide layer by means of a first electrical contact 402b. A second silicide layer 403a is formed on the second source/drain region 403, electrical contact being made with said second silicide layer by means of a second electrical contact 403b. A gate 406 and a gate dielectric 406a are formed above the P-type substrate/P-type well region 401 between the first source/drain region 402 and the second source/drain region 403, two spacers 416 being formed on the sides of said gate and gate dielectric. The MOS-FET 400 furthermore has two N-doped extension regions 404 formed in the P-type substrate/P-type well region 401, a respective extension region 404 being formed alongside the first source/drain region 402 and alongside the second source/drain region 403 below a spacer 416. Furthermore, the MOS-FET 400 has two P-type halo implantation regions 405 formed in the P-type substrate/P-type well region 401, a respective P-type halo implantation region 405 being formed below a spacer 416. The P-type halo implantation regions 405 are formed using a P-type halo photomask 415, the contour of which is illustrated in FIG. 4. The two extension regions 404 and the two P-type halo implantation regions 405 serve for suppressing short-channel effects in the MOS-FET 400.

One exemplary embodiment of the invention provides a method for producing an electronic component. In the method, a first doped connection region and a second doped connection region are formed on or above a substrate. Furthermore, a body region is formed between the first doped connection region and the second doped connection region. Furthermore, at least two gate regions separate from one another are formed on or above the body region. Furthermore, at least one partial region of the body region is doped by means of introducing dopant atoms, wherein the dopant atoms are introduced into the at least one partial region of the body region through at least one intermediate region formed between the at least two separate gate regions.

Another exemplary embodiment of the invention provides a method for producing a thyristor. In the method, a first doped connection region and a second doped connection region are formed on or above a substrate, wherein the first connection region has a first conductivity type and wherein the second connection region has a second conductivity type. Furthermore, at least two body regions are formed between the first connection region and the second connection region. At least one of the at least two body regions is doped by means of introducing dopant atoms of the first conductivity type and/or the second conductivity type, wherein the dopant atoms are introduced into the at least one of the at least two body regions using a halo implantation method and/or a Vt implantation method.

Another exemplary embodiment of the invention provides a method for producing a drain-extended MOS field-effect transistor, in which method a fin structure is formed on or above a substrate. A first doped connection region and a second doped connection region are formed in the fin structure, wherein the first connection region and the second connection region have a first conductivity type. Furthermore, a first body region and a second body region are formed between the first connection region and the second connection region, wherein the first body region is formed between the first connection region and the second body region, and wherein the second body region is formed between the first body region and the second connection region. Furthermore, the first body region and the second body region are doped by means of introducing dopant atoms in such a way that the first body region has the first conductivity type, and that the second body region has a second conductivity type, which is opposite to the first conductivity type. Furthermore, a gate region is formed on or above the second body region and on or above at least one partial region of the first body region.

Another exemplary embodiment of the invention provides a method for producing a drain-extended MOS field-effect transistor, in which method a silicon-on-insulator structure is formed on or above a substrate. A first doped connection region and a second doped connection region are formed in the silicon-on-insulator structure, wherein the first connection region and the second connection region have a first conductivity type. Furthermore, a first body region and a second body region are formed between the first connection region and the second connection region, wherein the first body region is formed between the first connection region and the second body region, and wherein the second body region is formed between the first body region and the second connection region. Furthermore, the first body region and the second body region are doped by means of introducing dopant atoms in such a way that the first body region has the first conductivity type, and that the second body region has a second conductivity type, which is opposite to the first conductivity type. Furthermore, a gate region is formed on or above the second body region and on or above at least one partial region of the first body region.

Another exemplary embodiment of the invention provides an electronic component comprising a first doped connection region and a second doped connection region, which are formed on or above a substrate. The electronic component furthermore has a body region formed between the first doped connection region and the second doped connection region. Furthermore, the electronic component has at least two gate regions separate from one another, which are formed on or above the body region. Furthermore, at least one partial region of the body region is doped with dopant atoms, wherein the dopant atoms are introduced into the at least one partial region of the body region through at least one intermediate region formed between the at least two separate gate regions.

Another exemplary embodiment of the invention provides a drain-extended MOS field-effect transistor having a fin structure. The fin structure has a first doped connection region and a second doped connection region, which are formed on or above a substrate, wherein the first connection region and the second connection region have a first conductivity type; a first doped body region and a second doped body region, which are formed between the first connection region and the second connection region, wherein the first body region is formed between the first connection region and the second body region, and wherein the second body region is formed between the first body region and the second connection region, and wherein the first body region has the first conductivity type and the second body region has a second conductivity type, which is opposite to the first conductivity type; a gate region formed on or above the second body region and at least one partial region of the first body region.

Another exemplary embodiment of the invention provides a drain-extended MOS field-effect transistor having a silicon-on-insulator structure. The silicon-on-insulator structure has a first doped connection region and a second doped connection region, which are formed on or above a substrate, wherein the first connection region and the second connection region have a first conductivity type; a first doped body region and a second doped body region, which are formed between the first connection region and the second connection region, wherein the first body region is formed between the first connection region and the second body region, and wherein the second body region is formed between the first body region and the second connection region, and wherein the first body region has the first conductivity type and the second body region has a second conductivity type, which is opposite to the first conductivity type; a gate region formed on or above the second body region and at least one partial region of the first body region.

Another exemplary embodiment of the invention provides an electronic component arrangement having a plurality of parallel-connected electronic components.

In accordance with another exemplary embodiment of the invention, at least one of the parallel-connected electronic components of the electronic component arrangement is formed as a thyristor or as a drain-extended MOS field-effect transistor.

In accordance with another exemplary embodiment of the invention, the substrate is formed as a semiconductor substrate, for example as a silicon substrate. The substrate can be formed as an intrinsic substrate, in other words as a substrate having an intrinsic conductivity. As an alternative, the substrate can be weakly doped (for example weakly p-doped); in other words, the substrate can have a weak background doping.

In accordance with another exemplary embodiment of the invention, an electrically insulating layer, for example a Buried Oxide Layer (BOX), is formed in the substrate. A buried oxide layer can be formed as a buried silicon dioxide layer in a substrate formed as a silicon substrate.

In accordance with another exemplary embodiment of the invention, the first connection region and/or the second connection region and/or the at least one body region formed between the first connection region and the second connection region have silicon material.

In accordance with another exemplary embodiment of the invention, the first connection region and/or the second connection region and/or the at least one body region formed between the first connection region and the second connection region are formed on an electrically insulating layer formed in the substrate, for example on a Buried Oxide Layer (BOX). The two connection regions and the at least one body region can clearly be formed in a (for example intrinsic) layer formed on a buried oxide layer.

In accordance with another exemplary embodiment of the invention, the first connection region and/or the second connection region are silicided. In other words, a first silicide layer is formed on the first connection region or in an upper partial region of the first connection region, and/or a second silicide layer is formed on the second connection region or in an upper partial region of the second connection region.

In accordance with another exemplary embodiment of the invention, the first silicide layer and/or the second silicide layer are formed such that a short circuit and/or an electrical contact or Schottky contact between the first silicide layer and a body region formed alongside the first connection region or between the second silicide layer and a body region formed alongside the second connection region is avoided.

In accordance with another exemplary embodiment of the invention, a first electrical contact is formed on the first connection region (or on a first silicide layer formed on the first connection region), and/or a second electrical contact is formed on the second connection region (or on a second silicide layer formed on the second connection region). By means of a first silicide layer formed on the first connection region, it is possible to reduce the contact resistance between the first electrical contact and the first connection region, and by means of a second silicide layer formed on the second connection region, it is possible to reduce the contact resistance between the second electrical contact and the second connection region.

In accordance with another exemplary embodiment of the invention, the first connection region and/or the second connection region are doped using an ion implantation method.

In accordance with another exemplary embodiment of the invention, an HDD implantation method (HDD: Highly Doped Drain) is used as the ion implantation method.

An HDD implantation method can be understood to mean a doping method which serves, for example in the production of a field-effect transistor, for forming one or more highly doped source/drain regions. Therefore, an HDD implantation method can alternatively also be referred to as a source/drain implantation method, and the dopant atoms introduced or implanted by means of an HDD implantation method can be referred to as HDD implants or as source/drain implants.

It should be noted in this connection that in a standard process flow in which the formation of a gate and of one or more spacers is provided, an HDD implantation is usually effected after the formation of the gate and after the formation of the spacer or spacers.

HDD implants used for n-type doping can also be referred to as N+ implants, and HDD implants used for p-type doping can also be referred to as P+ implants.

In accordance with another exemplary embodiment of the invention, in an HDD implantation method, the dopant atoms can be introduced into a region to be doped (for example the first connection region and/or the second connection region)

along the direction of the normal to the surface, in other words perpendicular to the surface or at an implantation angle of 0° (0 degrees of angle).

In accordance with another exemplary embodiment of the invention, the first connection region and/or the second connection region are doped in such a way (for example by means of an HDD implantation method) that they have a dopant concentration of approximately greater than $10^{20}$ cm$^{-3}$.

In accordance with another exemplary embodiment of the invention, the electronic component is formed in such a way that it has a silicon-on-insulator structure or SOI structure.

In other words, the electronic component can be produced in an SOI technology or using an SOI technology (for example an FD-SOI technology (FD-SOI: Fully Depleted Silicon on Insulator=silicon-on-insulator structure fully depleted of charge carriers)). To put it in yet another way, the method for producing an electronic component is compatible with an SOI technology or an SOI process flow, for example an FD-SOI process flow.

In accordance with another exemplary embodiment of the invention, the electronic component is formed such that it has a fin structure or a fin. In accordance with this exemplary embodiment, the first connection region and/or the second connection region and/or the body region formed between the first connection region and the second connection region can be formed such that they have or form a fin structure (fin). The fin structure or fin can be formed on an electrically insulating layer, e.g. on a Buried Oxide Layer (BOX) formed in the substrate.

In other words, the electronic component can be produced in a FinFET technology or a MuGFET technology. To put it in yet another way, the method for producing an electronic component is compatible with a FinFET technology (MuGFET technology) or a FinFET process flow (MuGFET process flow).

In accordance with another exemplary embodiment of the invention, the dopant atoms are introduced into the at least one partial region of the body region using an ion implantation method, to put it another way with the aid of an ion implantation.

In accordance with another exemplary embodiment of the invention, the dopant atoms are introduced into the at least one partial region of the body region using a halo implantation method.

A halo implantation method can be understood to mean a doping method in which dopant atoms are introduced or implanted into a region to be doped (for example into the at least one partial region of the body region) at an angle with respect to the normal to the surface (also called implantation angle). To put it another way, the dopant atoms are introduced obliquely with respect to the normal to the surface of the region to be doped. The implantation angle may be approximately 5° to 80° (5 to 80 degrees of angle), where the implantation angle is measured between the normal to the surface of the region to be doped and the propagation direction of the dopant atoms prior to impinging on the region to be doped. Accordingly, 0°=perpendicular to the surface, and 90°=parallel to the surface.

As an alternative, a halo implantation method can be understood to mean a doping method which, in the production of a field effect transistor, serves for increasing a well region dopant concentration locally (for example in a region around a curved source/drain region and/or below an extension), in order to suppress short-channel effects in the field-effect transistor (cf. FIG. 4).

It should be noted in this connection that in a standard process flow in which the formation of a gate and of one or more spacers is provided, a halo implantation is usually effected after the formation of the gate and before the formation of the spacer or spacers.

The dopant atoms introduced or implanted into a region to be doped by means of a halo implantation method are also referred to as halo implants. As an alternative, the halo implants can also be referred to as so-called pocket implants.

In accordance with another exemplary embodiment of the invention, a dopant concentration of approximately $10^{18}$ cm$^{-3}$ to $10^{19}$ cm$^{-3}$ in a region to be doped (for example in the at least one partial region of the body region) can be achieved with the aid of a halo implantation method.

In accordance with another exemplary embodiment of the invention, the dopant atoms are introduced into the at least partial region of the body region using a Vt implantation method.

A Vt implantation method can be understood to mean a doping method which serves, for example in the production of a MOS field-effect transistor, for setting a threshold voltage Vt in the MOS field-effect transistor.

It should be noted in this connection that in a standard process flow in which the formation of a gate is provided, a Vt implantation is usually effected before the formation of the gate.

The dopant atoms introduced or implanted by means of a Vt implantation method can be referred to as threshold voltage implants (Vt implants) or as channel implants.

In accordance with another exemplary embodiment of the invention, when using a Vt implantation method, the dopant atoms can be introduced into a region to be doped (for example into the at least one partial region of the body region) perpendicular to the surface, that is to say at an implantation angle of 0° (0 degrees of angle).

In accordance with another exemplary embodiment of the invention, a dopant concentration of approximately $10^{17}$ cm$^{-3}$ to $10^{18}$ cm$^{-3}$ in a region to be doped (for example in the at least one partial region of the body region) can be achieved with the aid of a Vt implantation method.

In accordance with another exemplary embodiment of the invention, the dopant atoms are introduced into the at least one partial region of the body region using an HDD implantation method. The HDD implantation method can be used as an alternative or in addition to a halo implantation method. In other words, an HDD implantation can be effected as an alternative or in addition to a halo implantation, that is to say that HDD implants can be introduced or implanted into the at least one partial region of the body region as an alternative or in addition to halo implants.

In accordance with another exemplary embodiment of the invention, when using an HDD implantation method, the dopant atoms can be introduced into a region to be doped (for example into the at least partial region of the body region) perpendicular to the surface, that is to say at an implantation angle of 0° (0 degrees of angle).

In accordance with another exemplary embodiment of the invention, an LDD implantation method (LDD: Lightly Doped Drain) can be used for introducing the dopant atoms.

An LDD implantation method can be understood to mean a doping method which serves, for example in the production of a MOS field-effect transistor, for increasing the dopant concentration in a doped region. As an alternative, an LDD implantation method can be understood to mean a doping method which serves for forming (source/drain) extension regions in a MOS transistor.

It should be noted in this connection that in a standard process flow in which the formation of a gate and of one or more spacers is provided, an LDD implantation is usually effected after the formation of the gate and before the formation of the spacer or spacers.

The dopant atoms introduced or implanted by means of an LDD implantation method can be referred to as LDD implants.

In accordance with another exemplary embodiment of the invention, when using an LDD implantation method, the dopant atoms can be introduced into a region to be doped (for example into the at least one partial region of the body region) at an implantation angle of 0° (0 degrees of angle that is to say perpendicular to the surface) to 50° (50 degrees of angle).

In accordance with another exemplary embodiment of the invention, a dopant concentration of approximately $10^{18}$ $cm^{-3}$ to $10^{20}$ $cm^{-3}$ in a region to be doped (for example in the at least one partial region of the body region) can be achieved with the aid of an LDD implantation method.

In accordance with exemplary embodiments of the invention, for the purpose of doping one or more partial regions of a body region, it is possible to use one or more implantation methods or implantations present in a process technology (e.g. halo implantation, Vt implantation, HDD implantation, LDD implantation), wherein the dopants are introduced through at least one intermediate region formed between at least two separate gate regions. Since the doping is effected through one or more intermediate regions (clearly gaps) between the at least two gate regions, it is possible to use, in a method for producing an electronic component, for the doping of the body region (or of the partial regions of the body region), for example also those implantations which, in a standard process flow, are not usually used until after the formation of a gate (such as, for example, halo implantation, LDD implantation, HDD implantation).

In accordance with another exemplary embodiment of the invention, the at least two gate regions separate from one another in each case have an electrically insulating layer (gate dielectric), e.g. an oxide layer (gate oxide). An electrically conductive gate layer (e.g. made of polysilicon, a metal or some other suitable electrically conductive material) can be formed on an electrically insulating layer of a gate region.

In accordance with another exemplary embodiment of the invention, in the case of an electronic component having a fin structure or a fin, the at least two gate regions can be formed on or above the fin structure. The at least two gate regions can be formed on or above at least one lateral face of the fin (clearly alongside the fin) and/or on or above the top face of the fin. The at least two gate regions can be formed on or above the body region formed in the fin such that the body region can be driven from the two lateral faces of the fin, for example by virtue of a gate dielectric (e.g. a gate oxide) being formed with a larger thickness on the top face of the fin than on the two lateral faces of the fin (double-gate structure). As an alternative, the at least two gate regions can be formed on or above the body region formed in the fin such that the body region can be driven from the two lateral faces and the top face of the fin, for example by virtue of a gate dielectric (e.g. a gate oxide) being formed with a small thickness both on the two lateral faces and on the top face of the fin (triple-gate structure or multi-gate structure).

In accordance with another exemplary embodiment of the invention, the body region is formed as an intrinsic region (to put it another way as a region having an intrinsic conductivity), wherein at least one partial region of the body region formed as an intrinsic region is doped by means of introducing dopant atoms.

In accordance with another exemplary embodiment of the invention, the intrinsic region can be formed for example from a partial region of an intrinsic semiconductor substrate, for example a partial region of the substrate which is formed above an electrically insulating layer (for example a buried oxide layer) formed in the substrate. Clearly, an electrically insulating layer (for example a buried oxide layer) can be formed in an intrinsic substrate, and an intrinsic body region can be formed from an intrinsic layer that remains after the formation of the electrically insulating layer above the latter, wherein at least one partial region of the intrinsic body region is doped in another process step of the method by means of introducing dopant atoms.

In accordance with another exemplary embodiment of the invention, the body region can be formed as a weakly doped region, for example as a weakly p-doped region, wherein at least one partial region of the weakly doped (e.g. weakly p-doped) body region is doped in another process step of the method by means of introducing dopant atoms.

In accordance with another exemplary embodiment of the invention, a weakly doped body region can be formed from a partial region of a weakly doped semiconductor substrate (for example a semiconductor substrate having a background doping such as, for example, a p-type background doping), for example from a partial region of the weakly doped substrate, which partial region is formed above an electrically insulating layer (for example a buried oxide layer) formed in the substrate. Clearly, an electrically insulating layer can be formed in a weakly doped substrate, and a weakly doped body region can be formed from a partial region of the weakly doped substrate that remains above the electrically insulating layer, wherein at least one partial region of the body region is doped in another process step of the method by means of introducing dopant atoms.

The at least two gate regions separate from one another which are formed on or above the body region clearly form a slotted gate or a slotted gate mask with individual gate regions (also called gate strips hereinafter), which gate regions or gate strips are separated from one another by intermediate regions or openings (i.e. regions that have no gate material).

The slotted gate can be formed on or above the body region, and the dopant atoms are introduced into the at least one partial region of the body region (for example by means of a halo implantation method and/or an HDD implantation method), clearly through the intermediate regions formed in the slotted gate (clearly through the slots or openings of the gate).

Clearly, one or more partial regions of the body region can be doped through a slotted gate mask. The partial regions which are doped are clearly the uncovered partial regions of the body region, that is to say the partial regions of the body region which are not covered by gate material. The partial regions of the body region which are formed directly below the gate regions can be blocked by the gate regions formed above them, such that the dopant atoms are introduced only into the uncovered partial regions of the body region that are formed below the intermediate regions.

In other words, the body region can be doped locally (i.e. below the intermediate regions or below the openings of the slotted gate), or the dopant atoms can be implanted locally (into the uncovered partial regions of the body region). As a result, dopant concentration maxima can be produced locally (i.e. in the doped partial regions) in the body region.

Clearly, with the aid of the doping through the slotted gate, it is possible to form in the body region alternately regions having a high dopant concentration (i.e. the doped partial regions below the intermediate regions) and regions having a low dopant concentration (i.e. the partial regions below the gate regions, which partial regions have e.g. an intrinsic conductivity or a weak substrate background doping).

In accordance with another exemplary embodiment of the invention, the at least one partial region of the body region can be n-doped and/or p-doped.

In accordance with another exemplary embodiment of the invention, an n-type doping of one or more partial regions of the body region can be effected by means of introducing n-type halo implants. As an alternative or in addition, an n-type doping can be effected by means of introducing N+ implants.

In accordance with another exemplary embodiment of the invention, a p-type doping of one or more partial regions of the body region can be effected by means of introducing p-type halo implants. As an alternative or in addition, a p-type doping can be effected by means of introducing P+ implants.

In accordance with another exemplary embodiment of the invention, the dopant concentration in one or more doped partial regions of the body region may be approximately $10^{18}$ $cm^{-3}$ to $10^{19}$ $cm^{-3}$ (when using a halo implantation method) or approximately greater than $10^{20}$ $cm^{-3}$ (when using an HDD implantation method). In other words, a partial region of the body region that is formed below an intermediate region may have, after the introduction of the dopant atoms (and before an outdiffusion of the dopant atoms that is described below), a dopant concentration of approximately $10^{18}$ $cm^{-3}$ to $10^{19}$ $cm^{-3}$ (when using a halo implantation method) or approximately greater than $10^{20}$ $cm^{-3}$ (when using an HDD implantation method).

It should be noted in this connection that a shading effect can be achieved by means of forming narrow distances between the individual gate regions (in other words narrow slots) and/or by means of using shallow implantation angles, such that in this case the dopant concentration in the doped partial regions can be lower than the standard concentration value for the respective implantation layer.

In accordance with another exemplary embodiment of the invention, on account of a dopant concentration gradient that forms in the body region between the doped partial regions (formed below the intermediate regions) of the body region (high dopant concentration) and the adjoining non-doped partial regions (formed below the gate regions) of the body region (low dopant concentration), a lateral outdiffusion of the dopant atoms introduced into the body region (or the doped partial regions of the body region) can occur. In other words, a portion of the dopant atoms introduced into an uncovered partial region of a body region can diffuse into the adjacent (non-doped) partial regions of the body region, such that the dopant profile of the doped partial region can extend into the non-doped partial region or partial regions adjacent to the doped partial region. A "dilution" of the introduced dopant atoms can clearly take place.

By means of lateral outdiffusion or dilution of the dopant atoms, it is clearly possible, in accordance with another exemplary embodiment of the invention, for one or more diluted weakly (or very weakly) doped body partial regions (also referred to as "diluted body regions") to be formed in the body region. In other words, one or more body partial regions can be formed in the body region, which body partial regions have a diluted dopant concentration or a diluted doping.

In accordance with another exemplary embodiment of the invention, with the aid of the doping through a slotted gate or a finely slotted gate mask, it is possible to achieve a dilution (or a reduction) of the dopant concentration in the at least one doped body partial region of the body region. In accordance with another exemplary embodiment of the invention, the doping can be effected for example with the aid of a halo implantation method and/or an HDD implantation method, wherein, in the case of a conventional halo implantation (that is to say without a slotted gate), for example a dopant concentration of approximately $10^{18}$ $cm^{-3}$ to $10^{19}$ $cm^{-3}$ is obtained and, in the case of a conventional HDD implantation (without a slotted gate), for example a dopant concentration of approximately $>10^{20}$ $cm^{-3}$ is obtained in a region to be doped.

If the body region is doped through a slotted gate, it is possible, in accordance with another exemplary embodiment of the invention, to achieve a diluted dopant concentration having a value of between approximately $10^{15}$ $cm^{-3}$ (basic doping of the substrate) and $10^{19}$ $cm^{-3}$ (halo doping) in the at least one doped body partial region on account of the outdiffusion mechanism described above, wherein the dopant concentration in the body partial region (at least averaged over the volume of the body partial region) may be approximately $10^{17}$ $cm^{-3}$ to $10^{18}$ $cm^{-3}$.

In other words, in accordance with one exemplary embodiment of the invention, it is possible to dilute the standard concentration values from approximately $10^{18}$ $cm^{-3}$ to $10^{19}$ $cm^{-3}$ (for a halo implantation) or $10^{20}$ $cm^{-3}$ (for an HDD implantation) to approximately $10^{17}$ $cm^{-3}$ to $10^{18}$ $cm^{-3}$, for example, by means of slotting (gate slotting) and outdiffusion.

In accordance with another exemplary embodiment of the invention, at least one first doped partial region having a first conductivity type and at least one second doped partial region having a second conductivity type are formed by means of introducing dopant atoms.

In accordance with another exemplary embodiment of the invention, the first connection region of the electronic component can be n-doped, for example by means of introducing N+ implants. As an alternative, the first connection region can be p-doped, for example by means of introducing P+ implants.

In accordance with another exemplary embodiment of the invention, the second connection region of the electronic component can be n-doped, for example by means of introducing N+ implants. As an alternative, the second connection region can be p-doped, for example by means of introducing P+ implants.

In accordance with another exemplary embodiment of the invention, the at least two gate regions separate from one another are formed such that at least two of the at least two gate regions separate from one another have a distance of approximately 5 nm to 500 nm. The at least two gate regions separate from one another can be formed for example such that two adjacent gate regions have a distance which is smaller than the minimum feature size F of the technology used. The distance between two adjacent gate regions may be for example 15 nm to 60 nm.

In accordance with another exemplary embodiment of the invention, at least one of the at least two gate regions separate from one another has a length of approximately 5 nm to 200 nm. It is also possible for a plurality or all of the gate regions to have a length of approximately 5 nm to 200 nm.

In accordance with another exemplary embodiment of the invention, the first connection region is formed such that it has a first conductivity type, and the second connection region is formed such that it has a second conductivity type, which is opposite to the first conductivity type. Furthermore, in accordance with this exemplary embodiment, at least one first doped partial region and at least one second doped partial region are formed in the body region, wherein the at least one first doped partial region has the second conductivity type, and wherein the at least one second doped partial region has the first conductivity type. In accordance with this exemplary embodiment, the at least one first doped partial region is formed between the first connection region and the at least one second doped partial region, and the at least one second doped partial region is formed between the at least one first doped partial region and the second connection region, such that, in accordance with this exemplary embodiment, the electronic component is formed as a thyristor or SCR (Silicon Controlled Rectifier).

In accordance with another exemplary embodiment of the invention, an electronic component formed as a thyristor or SCR can be used for example as an ESD protection element in an electrical circuit.

In accordance with another exemplary embodiment of the invention, the first connection region is p-doped (e.g. p+-doped), and the second connection region is n-doped (e.g. n+-doped). Furthermore, a plurality of n-doped first partial regions and a plurality of p-doped second partial regions are formed in the body region.

In accordance with another exemplary embodiment of the invention, with the aid of the plurality of n-doped first partial regions, a diluted n-doped first body partial region is formed in the body region, and with the aid of the plurality of p-doped second partial regions, a diluted p-doped second body partial region is formed in the body region, wherein the first body partial region is formed between the first connection region and the second body partial region and the second body partial region is formed between the first body partial region and the second connection region.

A p-doped first connection region of an electronic component formed as a thyristor can clearly be referred to as an anode region or an anode of the thyristor, while an n-doped second connection region can be referred to as a cathode region or a cathode of the thyristor.

In accordance with another exemplary embodiment of the invention, the diluted n-doped first body partial region and the diluted p-doped second body partial region of a thyristor can be formed by means of introducing dopant atoms (e.g. halo implants and/or HDD implants) through a slotted gate mask (as described above).

In accordance with another exemplary embodiment of the invention, the diluted n-doped first body partial region and the diluted p-doped second body partial region can clearly fulfil the function of the lightly doped body regions of a conventional thyristor structure (cf. FIG. 1).

In accordance with another exemplary embodiment of the invention, the lightly doped body regions of a thyristor can be formed with the aid of a halo implantation method, such that for example no well implantation is required, in contrast to a conventional method.

In accordance with another exemplary embodiment of the invention, a patterned or highly diluted dopant concentration can be formed in the body region (more precisely: in the diluted n-doped first body partial region or the diluted p-doped second body partial region) by means of introducing the dopant atoms through the intermediate regions.

In other words, the effective dopant concentration (for example of a halo implantation) can be reduced by introducing or implanting dopant atoms into at least one partial region of the body region through a patterned mask (for example a slotted gate mask or a gate having a slot structure), and by an outdiffusion of the implanted dopant atoms taking place, whereby a dilution of the doping can be achieved.

Another effect resulting from the use of a halo implantation method for introducing the dopant atoms can be seen in the fact that the introduction of the dopant atoms at an implantation angle that differs from 0° (oblique implantation) together with a shading effect of the individual gate regions can have the effect that an efficient dilution of the doping can be achieved, without for example a slotted gate having narrower slots being required.

In accordance with another exemplary embodiment of the invention, the introduction of the dopants (for example the implantation of halo implants) into the at least one partial region of the body region is effected before a possible formation of one or more spacers. One effect of this exemplary embodiment can be seen in the fact that the openings between the individual gate strips (in other words the intermediate regions between the gate regions separate from one another) have a larger width before the formation of the spacers.

Another effect can be seen in the fact that blocking of a siliciding is not necessary by means of the formation of the at least two gate regions (or gate strips) separate from one another on or above the body region.

In accordance with another exemplary embodiment of the invention, the at least two gate regions separate from one another are formed such that at least one first gate region formed on or above the first body partial region has a length of approximately 5 nm to 200 nm, and/or that at least one second gate formed on or above the second body partial region has a length of approximately 5 nm to 200 nm. The at least two gate regions separate from one another can be formed for example such that one or a plurality of the gate regions have a length which is smaller than the minimum feature size F of the technology used. The length of a gate region may be a few 10 nm, for example 15 nm to 60 nm.

In accordance with another exemplary embodiment of the invention, the distance between in each case two adjacent gate regions, in other words the width of an intermediate region formed between two adjacent gate regions, is approximately equal in magnitude to the length of the gate regions.

In accordance with another exemplary embodiment of the invention, electrical contact is made with at least one of the at least two gate regions separate from one another, for example with the aid of at least one electrical gate connection. A gate region with which electrical contact is made can be used for example as a control gate for improved triggering of a thyristor.

In accordance with another exemplary embodiment of the invention, for example a plurality of first gate regions can be formed on or above the first body partial region, and electrical contact can be made with them jointly by means of a first electrical gate connection. Furthermore, a plurality of second gate regions can be formed on or above the second body partial region, and electrical contact can be made with them jointly by means of a second electrical gate connection.

In accordance with another exemplary embodiment of the invention, the first connection region, the second connection region and the at least one doped partial region are formed such that they have the same conductivity type. Furthermore, in accordance with this exemplary embodiment, a diluted doped first body partial region is formed in the body region with the aid of the at least one doped partial region, which doped first body partial region serves as an extended drain region, wherein the doped first body partial region is formed such that a second body partial region is formed in the body region between the doped first body partial region and the second connection region, which second body partial region serves as a channel region. In accordance with this configuration, the doped first body partial region (that is to say the extended drain region) is formed between the first connection region and the second body partial region, and the second body partial region (that is to say the channel region) is formed between the doped first body partial region and the second connection region, such that a drain-extended MOS field-effect transistor (DE-MOS-FET) is formed in accordance with this exemplary embodiment.

One effect of this exemplary embodiment can be seen in the fact that an extended drain region of a DE-MOS-FET having a low doping can be formed by forming at least one doped partial region in the body region by means of introducing dopant atoms through at least one intermediate region (for example through openings or slots of a gate). As has already been described further above, a low dopant concentration (in other words a "diluted" dopant concentration) can be achieved in the extended drain region clearly by a dilution of the dopant atoms introduced into the at least one partial region of the body region.

In accordance with another exemplary embodiment of the invention, in the case of an electronic component formed as a drain-extended MOS field-effect transistor (DE-MOS-FET), the first connection region can clearly serve as a drain region or drain of the DE-MOS-FET, and the second connection region can clearly serve as a source region or a source of the DE-MOS-FET. The diluted doped first body partial region can serve as an extended drain region or a drain extension of the DE-MOS-FET, and the second body partial region can serve as a channel region of the DE-MOS-FET.

In accordance with another exemplary embodiment of the invention, the at least two gate regions separate from one another are formed such that a gate region is formed on or above the second body partial region (channel region), which gate region has a length of approximately 5 nm to 200 nm.

In accordance with another exemplary embodiment of the invention, electrical contact can be made (for example by means of a gate connection) with a gate region formed on or above the second body partial region (i.e. the channel region). The surface potential of the channel region can be controlled by means of the gate region with which electrical contact is made.

In accordance with another exemplary embodiment of the invention, the first connection region and the second connection region are n-doped (e.g. n+-doped), for example by means of an HDD implantation method. Furthermore, the first body partial region is formed as a diluted n-doped first body partial region in accordance with this exemplary embodiment. In other words, an extended drain region having a diluted n-type doping is formed. Clearly, it is thus possible to form a drain-extended NMOS field-effect transistor (DE-NMOS-FET), that is to say an N-channel MOS field-effect transistor having an extended drain region.

In accordance with another exemplary embodiment of the invention, the channel region (or the second body partial region) can have an intrinsic conductivity or a weak background doping (e.g. weak p-type background doping).

In accordance with another exemplary embodiment of the invention, the first connection region and the second connection region are p-doped (e.g. p+-doped), for example by means of an HDD implantation method. Furthermore, the first body partial region is formed as a diluted p-doped first body partial region in accordance with this exemplary embodiment. In other words, an extended drain region having a diluted p-type doping is formed. Clearly, it is thus possible to form a drain-extended PMOS field-effect transistor (DE-PMOS-FET), that is to say a P-channel MOS field-effect transistor having an extended drain region.

In accordance with another exemplary embodiment of the invention, a silicide layer is formed in or on the body region below the at least one intermediate region. In other words, one or a plurality of partial regions of the body region formed below the at least one intermediate region can be silicided. To put it in yet another way, one or more of the uncovered partial regions of the body region can be silicided.

In accordance with another exemplary embodiment of the invention, the formation of a siliciding of the uncovered partial regions of the body region can be blocked, for example using a mask.

One effect of some exemplary embodiments of the invention can be seen in the fact that a drain-extended MOS field-effect transistor (DE-MOS-FET) can be formed by means of a method for producing an electronic component, which DE-MOS-FET is suitable for example for use with higher supply voltages.

The configurations of the invention that are described below relate to the method for producing a thyristor.

In accordance with another exemplary embodiment of the invention, the doping of the at least one of the at least two body regions can be effected using a halo photomask.

In accordance with another exemplary embodiment of the invention, the first connection region is p-doped, and the second connection region is n-doped.

In accordance with another exemplary embodiment of the invention, the doping of the first connection region and/or the doping of the second connection region is effected using a photomask.

In accordance with another exemplary embodiment of the invention, a first body region and a second body region are formed between the first connection region and the second connection region, wherein the body region is formed between the first connection region and the second body region and wherein the second body region is formed between the first body region and the second connection region. In accordance with this exemplary embodiment, the first body region is n-doped, and the second body region is p-doped.

In accordance with another exemplary embodiment of the invention, a gate region is formed on or above the first body region and the second body region. The gate region can be used as a mask during the doping of the first connection region and/or of the second connection region.

One effect of the exemplary embodiment just mentioned can be seen in the fact that a self-aligned definition of the body regions can be achieved by means of the use of a gate region (or gate stack) as a mask or mask layer without additional process complexity (for example in the form of silicide blocking) being added.

Furthermore, in accordance with another exemplary embodiment of the invention, the gate region can be used as a mask during a siliciding of the first connection region and/or of the second connection region.

In accordance with another exemplary embodiment of the invention, a first body region, a second body region and a third body region are formed between the first connection region and the second connection region, wherein the first body region is formed between the first connection region and the third body region, wherein the second body region is formed between the third body region and the second connection region, and wherein the third body region is formed between the first body region and the second body region. In accordance with this exemplary embodiment, the first body region and the second body region are formed as intrinsic regions (in other words as regions having intrinsic conductivity), and the third body region is p-doped and/or n-doped. Furthermore, a first gate region is formed above the second body region, and a second gate region is formed above the first body region.

In accordance with another exemplary embodiment of the invention, the doping of the third body region can additionally be effected using an HDD implantation method or an LDD implantation method.

In accordance with another exemplary embodiment of the invention, the third body region is p-doped, and a fourth body region is formed between the second body region and the third body region, which fourth body region is n-doped.

In accordance with another exemplary embodiment of the invention, the doping of the third body region and/or the doping of the fourth body region is effected after the formation of the first gate region and/or after the formation of the second gate region.

In accordance with another exemplary embodiment of the invention, at least one gate region of the thyristor can have an electrically insulating layer (gate dielectric), e.g. an oxide layer (gate oxide). In accordance with another exemplary embodiment of the invention, an electrically conductive gate layer (e.g. made of polysilicon, a metal or some other suitable electrically conductive material) can be formed on an electrically insulating layer of a gate region.

In accordance with another exemplary embodiment of the invention, in the case of a thyristor having a fin structure or a fin, at least one gate region can be formed on or above at least one of the least two body regions such that the at least one of the at least two body regions can be driven from the two lateral faces of the fin (double-gate structure). As an alternative, the at least one gate region can be formed such that the at least one of the at least two body regions can be driven from the two lateral faces and the top face of the fin (triple-gate structure or multi-gate structure).

In accordance with another exemplary embodiment of the invention, in SOI technologies or MuGFET technologies, the presence of a Buried Oxide Layer (BOX) enables the production of a novel, exclusively lateral pn junction. In accordance with another exemplary embodiment of the invention, the pn junction can be formed from a halo region (that is to say a region that was doped with the aid of a halo implantation) and a connection region (or source/drain region). A new method for forming a four-layer SCR structure is thus provided in accordance with one exemplary embodiment of the invention.

The exemplary embodiments described below relate to methods for producing a drain-extended MOS field-effect transistor and drain-extended MOS field-effect transistors in accordance with exemplary embodiments of the invention.

In accordance with one exemplary embodiment of the invention, in the case of a drain-extended MOS field-effect transistor having a silicon-on-insulator structure, the first connection region, the second connection region and also the first body region and the second body region of the drain-extended MOS field-effect transistor can be formed on an electrically insulating layer, e.g. on a Buried Oxide Layer (BOX) formed on the substrate.

A drain-extended MOS field-effect transistor produced in a FinFET technology can also be referred to as a drain-extended FinFET.

In accordance with another exemplary embodiment of the invention, a method for producing a drain-extended MOS field-effect transistor or a drain-extended MOS field-effect transistor (DE-MOS-FET) is provided, i.e. a MOS field-effect transistor having an extended drain region, which drain-extended MOS field-effect transistor is suitable for example for use with high input/output supply voltages (I/O supply voltage), e.g. with supply voltages of approximately 1.5 V to 2.5 V.

In other words, in accordance with one exemplary embodiment of the invention, a drain-extended MOS field-effect transistor (DE-MOS-FET) can be used for applications such as I/O circuits, for example. As an alternative, however, the DE-MOS-FET can also be used in other applications.

In accordance with another exemplary embodiment of the invention, the drain-extended MOS field-effect transistor can be produced in a FinFET technology (or MuGFET technology) or in an SOI technology (e.g. FD-SOI technology).

In accordance with another exemplary embodiment of the invention, the doping of the first body region and/or of the second body region can be effected using a Vt implantation method.

In accordance with another exemplary embodiment of the invention, the first connection region, the first body region and the second connection region are n-doped, and the second body region is p-doped, such that a drain-extended NMOS field-effect transistor is formed.

In accordance with another exemplary embodiment of the invention, the first connection region, the first body region and the second connection region are p-doped, and the second body region is n-doped, such that a drain-extended PMOS field-effect transistor is formed.

In accordance with another exemplary embodiment of the invention, the gate region is formed such that a partial region of the first body region remains free of the gate region. The length of the partial region free of the gate region may be for example approximately 50 nm to 2000 nm.

In accordance with another exemplary embodiment of the invention, one or more of the following regions of the drain-extended MOS field-effect transistor is or are silicided: the first connection region, the second connection region, the gate region, that partial region of the first body region which is free of the gate region.

In accordance with another exemplary embodiment of the invention, a mask is used, with the aid of which a siliciding of that partial region of the first body region which is free of the gate region is blocked.

One effect of a method for producing a drain-extended MOS field-effect transistor (DE-MOS-FET) in accordance with one exemplary embodiment of the invention can be seen in the fact that the DE-MOS-FET (or the method) is compatible with an emerging MuGFET process technology. Another effect can be seen in the fact that the method is also compatible with already existing SOI technologies, no additional process steps being required, for example.

Furthermore, in accordance with another exemplary embodiment of the invention, better-controllable and/or reduced outdiffusion can be achieved by means of a novel method for forming an extended drain region and thus the actual gate length of DE-MOS-FET.

Another effect of a method for producing a drain-extended MOS field-effect transistor (DE-MOS-FET) in accordance with one exemplary embodiment of the invention can be seen in the fact that both NMOS device structures and PMOS device structures can be produced by the method.

FIG. 5A shows a cross-sectional view of a thyristor 500 or SCR (Silicon Controlled Rectifier) 500 produced by means of a method for producing a thyristor in accordance with a first exemplary embodiment of the invention. The thyristor 500 has an SOI structure (SOI: Silicon On Insulator) fully depleted of charge carriers, that is to say on FD-SOI structure (Fully Depleted SOI).

In accordance with the exemplary embodiment shown, in the method for producing the thyristor 500, a first process step involves forming a Buried Oxide Layer (BOX) 501 in a semiconductor substrate (not shown), for example in a silicon substrate, in such a way that a thin (monocrystalline) silicon layer (not shown, cf. layer 1007' in FIG. 10A) is formed on the surface of the substrate.

In another process step of the method, an n-doped first body region 504 is formed in the silicon layer by means of a halo implantation method (alternatively or additionally by means of a Vt implantation method). The n-type doping of the first body region 504 is effected using an N-type halo photomask (or an N-Vt photomask), the contour 514 of which is illustrated in FIG. 5A.

In another process step of the method, a p-doped second body region 505 is formed in the silicon layer by means of a halo implantation method (alternatively or additionally by means of a Vt implantation method). The p-type doping of the second body region 505 is effected using a P-type halo photomask (or a P-Vt photomask), the contour 515 of which is illustrated in FIG. 5A. The p-doped second body region 505 is formed alongside the n-doped first body region 504 in such a way that the n-doped first body region 504 and the p-doped second body region 505 have a common first interface. Clearly, the first body region 504 and the second body region 505 form a first pn junction of the thyristor 500.

The introduction of the dopant atoms into the first body region 504 (n-type doping) and/or into the second body region 505 (p-type doping) by means of the halo implantation method can be effected at an implantation angle of approximately 5° to 80°. The dopant concentration in the first body region 504 and/or in the second body region 505 may be approximately $10^{18}$ cm$^{-3}$ to $10^{19}$ cm$^{-3}$.

In another process step of the method, a heavily p-doped (P+) first connection region 502 is formed in the silicon layer by means of an HDD implantation method (HDD: Highly Doped Drain). The p-type doping of the first connection region 502 is effected using a P+-type photomask, the contour 512 of which is illustrated in FIG. 5A. The heavily p-doped first connection region 502 is formed alongside the n-doped first body region 504 in such a way that the n-doped first body region 504 and the p-doped second body region 505 have a common second interface. Clearly, the heavily p-doped first connection region 502 and the n-doped first body region 504 form a second pn junction of the thyristor 500.

In another process step of the method, a heavily n-doped (N+) second connection region 503 is formed in the silicon layer by means of an HDD implantation method (HDD: Highly Doped Drain). The n-type doping of the second connection region 503 is effected using an N+-type photomask, the contour 513 of which is illustrated in FIG. 5A. The heavily n-doped second connection region 503 is formed alongside the p-doped second body region 505 in such a way that the p-doped second body region 505 and the n-doped second connection region 503 have a common third interface. Clearly, the p-doped second body region 505 and the heavily n-doped second connection region 503 form a third pn junction of the thyristor 500.

The dopant concentration in the first body region 504 and/or in the second body region 505 may be approximately greater than $10^{20}$ cm$^{-3}$.

In another process step of the method, the first connection region 502 and the second connection region 503 are silicided. In other words, a first silicide layer 502a is formed on the first connection region 502 or in an upper partial region of the first connection region 502, and a second silicide layer 503a is formed on the second connection region 503 or in an upper partial region of the second connection region 503. A siliciding of the first body region 504 and of the second body region 505 can be prevented or blocked with the aid of a mask (silicide blocking mask), where the mask can clearly be formed from the forms of the masks 514 and 515.

In the exemplary embodiment shown in FIG. 5A and also in the subsequent exemplary embodiments, the silicide layers (e.g. the first silicide layer 502a and the second silicide layer 503a) formed on the connection regions or in upper partial regions of the respective connection regions can be formed such that a short circuit and/or a Schottky contact between a silicide layer and a body region formed alongside the corresponding connection region is avoided.

In another process step of the method, a first electrical contact 502b is formed on the first silicide layer 502a, and a second electrical contact 503b is formed on the second silicide layer 503a. The first electrical contact 502b serves for making electrical contact with the first connection region 502, wherein the contact resistance between the first electrical contact 502b and the first connection region 502 can be reduced with the aid of the first silicide layer 502a. Correspondingly, the second electrical contact 503b serves for making electrical contact with the second connection region 503, wherein the contact resistance between the second electrical contact 503b and the second connection region 503 can be reduced with the aid of the second silicide layer 503a.

The first connection region 502, the first silicide layer 502a and the first electrical contact 502b clearly form an anode region of an anode (identified by "anode" in FIG. 5A) of the thyristor 500, while the second connection region 503, the second silicide layer 503a and the second electrical contact 503b clearly form a cathode region or a cathode (identified by "cathode" in FIG. 5A) of the thyristor 500.

The heavily p-doped first connection region 502 (P+), the n-doped first body region 504, the p-doped second body region 505 and the heavily n-doped second connection region 503 (N+) together form a pnpn four-layer structure of the thyristor 500 with a total of three pn junctions.

In accordance with the exemplary embodiment of the invention described in connection with FIG. 5A, the first body region 504 and the second body region 505 of the thyristor 500 can be formed by means of implanting halo implants (alternatively or additionally by means of Vt implants) into predetermined (for example lithographically defined) regions. This is a non-self-aligned process. The complete thyristor 500 can be obtained by means of silicide blocking or by means of masking with the aid of a gate (cf. FIG. 5B).

In an alternative exemplary embodiment (not shown) of the invention, the thyristor 500 can be formed using a MuGFET technology. In other words, the thyristor 500 in this case can have a fin structure with a fin in which the two connection regions 502, 503 and the two body regions 504, 505 of the thyristor 500 are formed.

In SOI technologies or MuGFET technologies, the presence of the buried oxide layer 501 enables the production of a novel, exclusively lateral pn junction between a halo region, to put it another way a region doped with the aid of a halo implantation (i.e. the two body regions 504 and 505), and a highly doped connection region (i.e. the two connection regions 502 and 503).

FIG. 5B shows a cross-sectional view of a thyristor 520 produced by means of a method for producing a thyristor in accordance with a second exemplary embodiment of the invention. The thyristor 520 has an SOI structure (SOI: Silicon on Insulator) fully depleted of charge carriers, i.e. an FD-SOI structure (Fully Depleted SOI).

In accordance with the exemplary embodiment shown, in the method for producing the thyristor 520, a first process step involves forming a Buried Oxide Layer (BOX) 501 in a semiconductor substrate (not shown), for example in a silicon substrate, in such a way that a thin silicon layer (not shown, cf. layer 1007' in FIG. 10A) is formed on the substrate surface.

In another process step of the method, an n-doped first body region 504 (N−) is formed in the silicon layer by means of a Vt implantation method. The n-type doping of the first body region 504 can be effected, as described in connection with FIG. 5A, using an N-type Vt photomask.

In another process step of the method, an p-doped first body region 505 (P−) is formed in the silicon layer by means of a Vt implantation method. The p-type doping of the first body region 505 can be effected, as described in connection with FIG. 5A, using a P-type Vt photomask.

The p-doped second body region 505 is formed alongside the n-doped first body region 504 in such a way that the n-doped first body region 504 and the p-doped second body region 505 have a common first interface. Clearly, the first body region 504 and the second body region 505 form a first pn junction of the thyristor 520.

The dopant concentration in the first body region 504 and/or in the second body region 505 may be approximately $10^{18}$ cm$^{-3}$ to $10^{19}$ cm$^{-3}$.

In another process step of the method, a gate region 506 is formed on or above the first body region 504 and the second body region 505, which gate region 506 is electrically coupled to a gate connection G. The gate region 506 has an electrically insulating layer 506' (gate dielectric), e.g. a gate oxide, which electrically insulating layer 506' is formed on the first body region 504 and the second body region 505, and also an electrically conductive layer 506" (conductive gate layer e.g. made of polysilicon, a metal or some other suitable electrically conductive material) formed on the electrically insulating layer 506'.

In another process step of the method, a heavily p-doped (P+) first connection region 502 is formed in the silicon layer by means of an HDD implantation method (HDD: Highly Doped Drain), wherein the gate region 506 serves as a mask, such that the P+ implantation is blocked in the region below the gate region 506 (that is to say in the two body regions 504 and 505). The heavily p-doped first connection region 502 is formed alongside the n-doped first body region 504 in such a way that the n-doped first body region 504 and the p-doped second body region 505 have a common second interface. Clearly, the heavily p-doped first connection region 502 and the n-doped first body region 504 form a second pn junction of the thyristor 520.

In another process step of the method, a heavily n-doped (N+) second connection region 503 is formed in the silicon layer by means of an HDD implantation method (HDD: Highly Doped Drain), wherein the gate region 506 once again serves as a mask, such that the N+ implantation is blocked in the region below the gate region 506 (that is to say in the two body regions 504 and 505). The heavily n-doped second connection region 503 is formed alongside the p-doped second body region 505 in such a way that the p-doped second body region 505 and the n-doped second connection region 503 have a common third interface. Clearly, the p-doped second body region 505 and the heavily n-doped second connection region 503 form a third pn junction of the thyristor 520.

The dopant concentration in the first connection region 502 and/or in the second connection region 503 may be approximately greater than $10^{20}$ cm$^{-3}$.

In another process step of the method, the first connection region 502, the second connection region 503 and the gate region 506 are silicided. In other words, a first silicide layer 502a is formed on the first connection region 502 or in an upper partial region of the first connection region 502, a second silicide layer 503a is formed on the second connection region 503 or in an upper partial region of the second connection region 503, and a third silicide layer 506a is formed on the gate region 506. A siliciding of the first body region 504 and of the second body region 505 is in this case once again prevented or blocked with the aid of the gate region 506 or the gate stack 506, which gate region 506 clearly serves as a mask.

Clearly, in the exemplary embodiment of the invention described in connection with FIG. 5B, the gate region 506 or gate stack 506 (for example the polysilicon material or metal material of the gate electrode 506") is used as a mask layer in order to block an HDD implantation (N+ implantation or P+ implantation) and/or a siliciding in the lightly doped first body region 504 and the lightly doped second body region 505. In other words, the gate stack 506 can be used as a mask layer or mask in order to achieve a self-aligned definition of the body regions 504 and 505 of the thyristor 520 without adding additional process complexity such as silicide blocking, for example.

Analogously to the exemplary embodiment described in connection with FIG. 5A, in the method for producing the thyristor 520, in other process steps a first electrical contact 502b is formed on the first silicide layer 502a and a second electrical contact 503b is formed on the second silicide layer 503a.

The gate region 506 or the gate 506 of the thyristor 520 shown in FIG. 5B can be used as a control gate in order to achieve improved triggering of the thyristor. For this purpose, an electrical potential present at the gate 506 can be correspondingly controlled by means of the gate connection G, whereby the surface potential of the first body region 504 and/or of the second body region 505 can once again be controlled.

The thyristor 520 shown in FIG. 5B is produced with the aid of an SOI technology. In an alternative exemplary embodiment (not shown) of the invention, the thyristor 520 can be formed using a MuGFET technology. In other words, the thyristor in this case can have a fin structure with a fin in which the two connection regions 502, 503 and the two body regions 504, 505 of the thyristor 520 are formed.

In the case of a thyristor comprising a fin structure or fin, the gate 506 can be formed on or above the first body region 504 and the second body region 505 such that the first body region 504 and the second body region 505 can be driven from the two lateral faces of the fin (double-gate structure). As an alternative, the gate 506 can be formed such that the two body regions 504 and 505 can be driven from the two lateral faces and the top face of the fin (triple-gate structure or multi-gate structure).

Figure 6A:
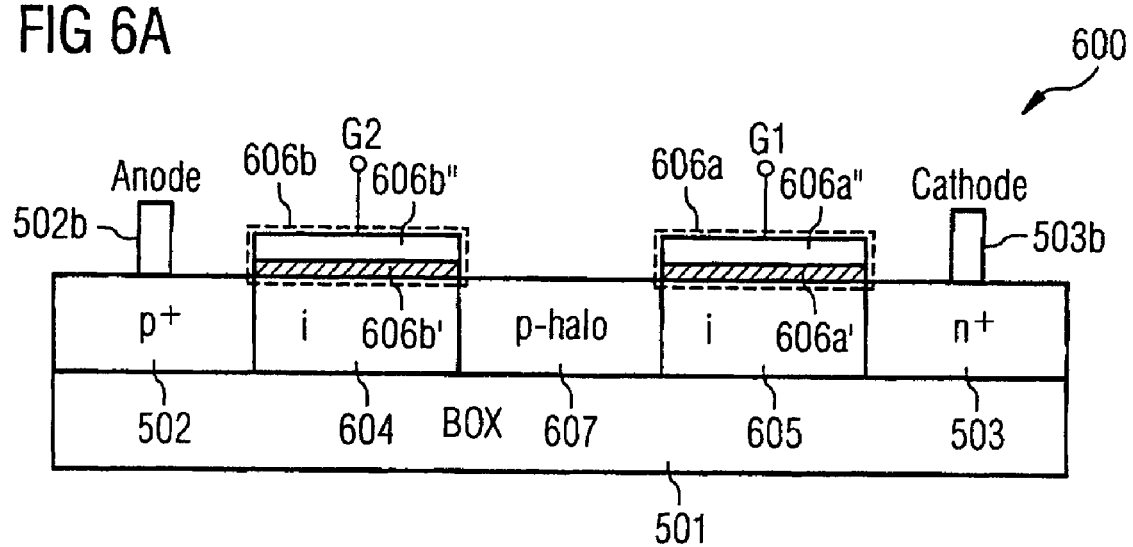
FIG. 6A shows a thyristor produced by means of a method for producing a thyristor in accordance with a third exemplary embodiment of the invention.

FIG. 6A shows a cross-sectional view of a thyristor 600 produced by means of a method for producing a thyristor in accordance with a third exemplary embodiment of the invention. The thyristor 600 has an SOI structure (SOI: Silicon On Insulator) fully depleted of charge carriers, that is to say an FD-SOI structure (Fully Depleted SOI).

In accordance with the exemplary embodiment shown, in the method for producing the thyristor 600, a first process step involves forming a Buried Oxide Layer (BOX) 501 in a semiconductor substrate (not shown), for example in a silicon substrate, in such a way that a thin silicon layer (not shown, cf. layer 1007' in FIG. 10A) is formed at the surface of the substrate.

Other process steps of the method involve forming, in the silicon layer, a first connection region 502 and a second connection region 503, and also a first body region 604, a second body region 605 and a third body region 607, the first body region 604 being formed between the first connection region 502 and the third body region 607, the second body region 605 being formed between the third body region 607 and the second connection region 503, and the third body region 607 being formed between the first body region 604 and the second body region 605.

The first body region 604 is formed as a region having an intrinsic conductivity or as an intrinsic region (identified by "i" in FIG. 6A), and the second body region 605 is likewise formed as an intrinsic region (likewise identified by "i" in FIG. 6A).

The third body region 607 formed between the intrinsic first body region 604 and the intrinsic second body region 605 is formed by means of a halo implantation method as a p-doped third body region 607 (P-halo). A first gate region 606a is formed on or above the intrinsic second body region 605, which first gate region 606a is electrically coupled to a first gate connection G1. The first gate region 606a has a first electrically insulating layer 606a' (gate dielectric) formed on the second body region 605, e.g. a gate oxide, and also a first electrically conductive layer 606a" formed on the first electrically insulating layer 606a' (conductive gate layer e.g. made of polysilicon, a metal or some other suitable electrically conductive material). Furthermore, a second gate region 606b is formed on or above the intrinsic first body region 604, which second gate region 606b is electrically coupled to a second gate connection G2. The second gate region 606b has a second electrically insulating layer 606b' (gate dielectric) formed on the first body region 604, e.g. a gate oxide, and also a second electrically conductive layer 606b" formed on the second electrically insulating layer 606b' (conductive gate layer e.g. made of polysilicon, a metal or some other suitable electrically conductive material).

In accordance with the exemplary embodiment shown, the formation of the p-type doping in the third body region 607 is effected after the formation of the first gate region 606a and after the formation of the second gate region 606b by means of introducing halo implants into the third body region 607 (halo implantation), the first gate region 606 and the second gate region 606' clearly serving as a mask.

In an alternative configuration of the invention, alternatively it is possible firstly to effect the doping of the third body region 607 by means of P-type Vt implantation (e.g. using a lithographic mask or a Vt photomask, not shown), and it is then possible to form the first gate region 606a and the second gate region 606b on or above the first body region 604 and the second body region 605.

When using a halo implantation method, the dopant atoms can be introduced into the third body region 607 at an implantation angle of approximately 5° to 80°.

Both when using a halo implantation and when using a Vt implantation, the third body region 605 can be doped in such a way that the dopant concentration in the third body region 605 is approximately $10^{18}$ cm$^{-3}$ to $10^{19}$ cm$^{-3}$.

In another process step of the method, the first connection region 502 is heavily p-doped (P+) by means of an HDD implantation method (HDD: Highly Doped Drain), the second gate region 606b serving as a mask, such that the HDD implantation is blocked below the second gate region 606b (i.e. in the region of the intrinsic first body region 604). Analogously, in another process step of the method, the second connection region 503 is heavily n-doped (N+) by means of an HDD implantation method (HDD: Highly Doped Drain), the first gate region 606a serving as a mask, such that the HDD implantation is blocked below the first gate region 606a (i.e. in the region of the intrinsic second body region 605). It should be noted in this connection that the masking effect of the gate regions 606a and 606b is only utilized for the precise, self-aligning orientation of the respective implantations. In addition, "global" N+/P+ masks may be present in the process and are concomitantly utilized in the definition of the highly doped connection regions 502 and 503.

The dopant concentration in the first connection region 502 and/or in the second connection region 503 can be approximately greater than $10^{20}$ cm$^{-3}$.

Figure 6B:
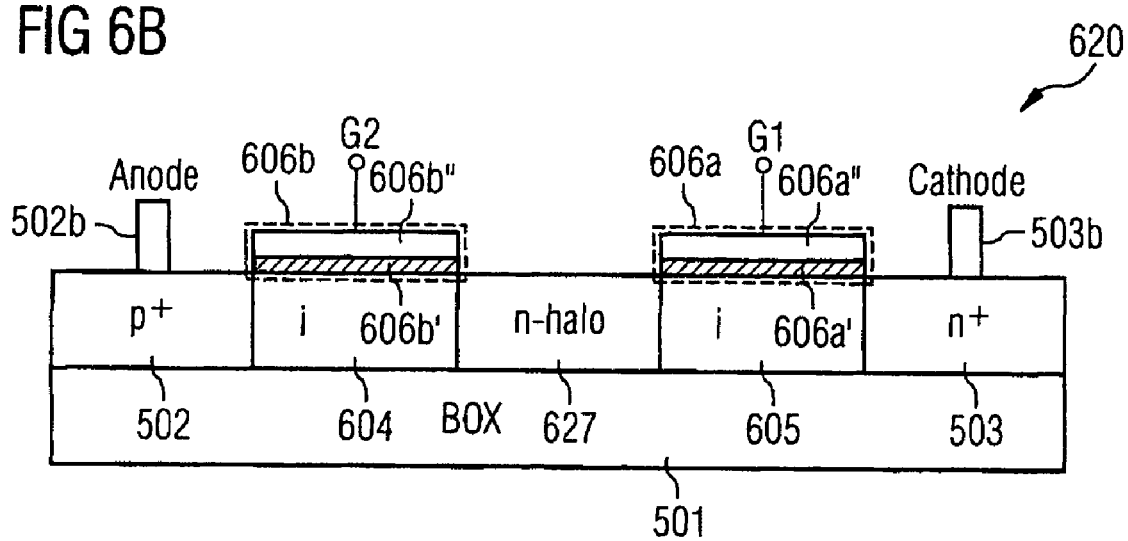
FIG. 6B shows a thyristor produced by means of a method for producing a thyristor in accordance with a fourth exemplary embodiment of the invention.
Figure 6C:
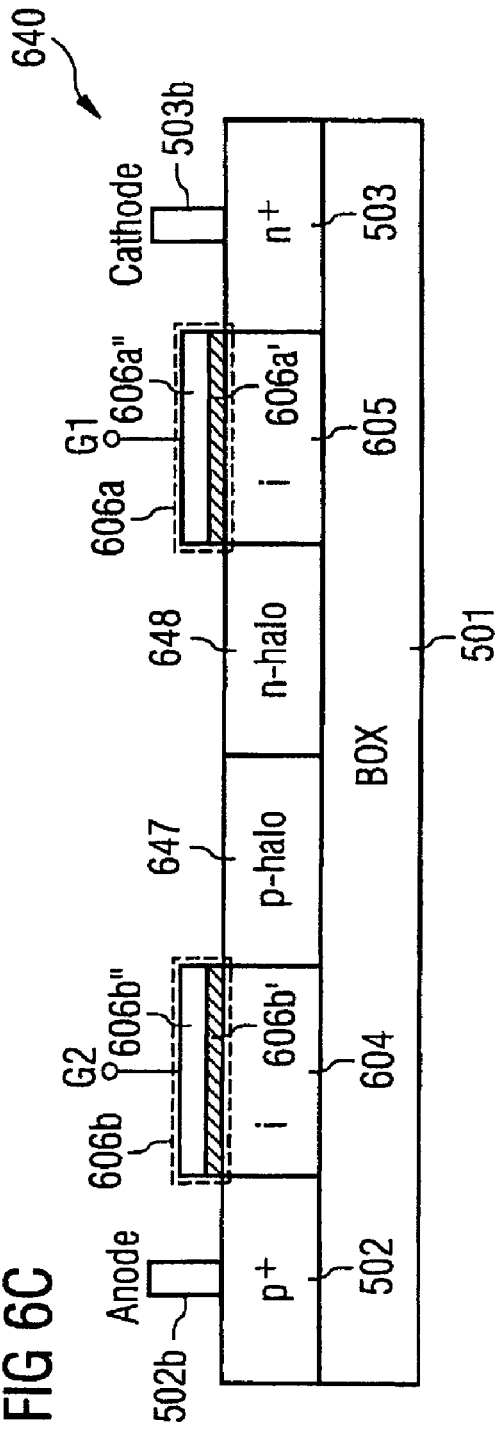
FIG. 6C shows a thyristor produced by means of a method for producing a thyristor in accordance with a fifth exemplary embodiment of the invention.
Figure 6D:
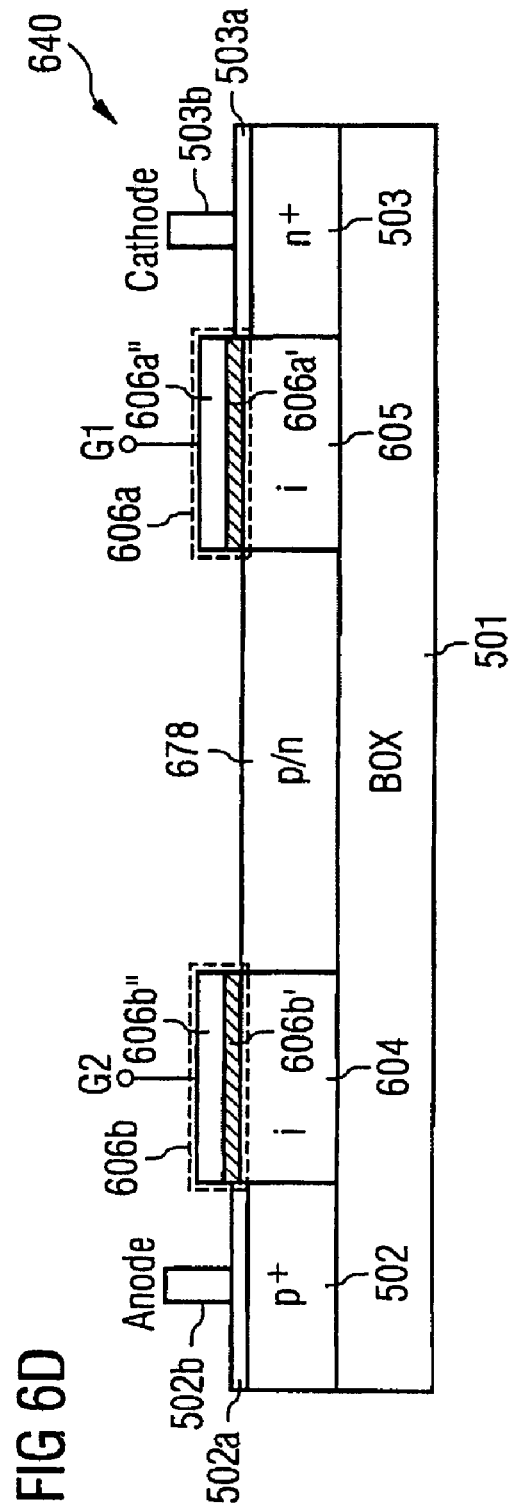
FIG. 6D shows a thyristor produced by means of a method for producing a thyristor in accordance with a sixth exemplary embodiment of the invention.

In another process step of the method, a first electrical contact 502b is formed on the first connection region 502 (alternatively on a first silicide layer 502a formed on the first connection region 502, cf. FIG. 6D), and a second electrical contact 503b is formed on the second connection region 503 (alternatively on a second silicide layer 503a formed on the second connection region 503, cf. FIG. 6D). The first electrical contact 502b serves for making electrical contact with the first connection region 502. The second electrical contact 503b correspondingly serves for making electrical contact with the second connection region 503.

The first connection region 502 (the optional first silicide layer 502a) and the first electrical contact 502b clearly form an anode region or an anode (identified by "anode" in FIG. 6A) of the thyristor 600, while the second connection region 503 (the optional second silicide layer 503a) and the second electrical contact 503b clearly form a cathode region or a cathode (identified by "cathode" in FIG. 6A) of the thyristor 600.

In an alternative exemplary embodiment (not shown) of the invention, the thyristor 600 can be formed using a MuGFET technology. In other words, in this case the thyristor 600 has a fin structure comprising a fin in which the two connection regions 502, 503 and the three body regions 604, 605 and 607 of thyristor 600 are formed.

In the case of a thyristor comprising a fin structure or fin, the first gate 606a and/or the second gate 606b can be formed in such a way that the second body region 605 and/or the first body region 604 can be driven from the two lateral faces of the fin (double-gate structure). As an alternative, the first gate 606a and/or the second gate 606b can be formed in such a way that the second body region 605 and/or the first body region 604 can be driven from the two lateral faces and the top face of the fin (triple-gate structure or multi-gate structure).

FIG. 6B shows a cross-sectional view of a thyristor 620 produced by means of a method for producing a thyristor in accordance with a fourth exemplary embodiment of the invention. In contrast to the thyristor 600 shown in FIG. 6A, the thyristor 620 has an n-doped third body region 627, in which case the n-type doping of the third body region 627 can be obtained by means of a halo implantation method (alternatively by means of a Vt implantation method). The method for producing the thyristor 620 shown in FIG. 6B is analogous to the thyristor 600 shown in FIG. 6A and will therefore not be described again, for the sake of brevity. The thyristor 620, like the thyristor 600, can be produced with the aid of an SOI technology (e.g. an FD-SOI technology) or a MuGFET technology.

The thyristors 600 and 620 shown in FIG. 6A and FIG. 6B, respectively, clearly have a central region (i.e. the third body region 607 and 627, respectively) with one dopant type which is formed between two intrinsic regions (first body region 604 and second body region 605).

FIG. 6C shows a cross-sectional view of a thyristor 640 produced by means of a method for producing a thyristor in accordance with a fifth exemplary embodiment of the invention. The method for producing the thyristor 640 differs from the method described in connection with FIG. 6A in that, in the case of the thyristor 640, an n-doped fourth body region 648 is formed in addition to a p-doped third body region 647, the fourth body region 648 being formed between the p-doped third body region 647 and the intrinsic second body region

605. Clearly, the central region of the thyristors 600 and 620 (that is to say the p-doped third body region 607 and the n-doped third body region 627, respectively) having only one dopant type is replaced in the case of the thyristor 640 by a central region formed from two partial regions having opposite doping (i.e. the p-doped third body region 647 and the n-doped fourth body region 648), which central region is formed between the two intrinsic regions 604 and 605. The method for producing the thyristor 640 is similar to the method described in connection with FIG. 6A and is therefore not repeated again at this juncture.

The thyristor 640, like the thyristors 600 and 620 described above, can be produced with the aid of an SOI technology (e.g. an FD-SOI technology) or a MuGFET technology, and the structure 640 shown is compatible with a standard process flow in the corresponding technology.

FIG. 6D shows a cross-sectional view of a thyristor 660 produced by means of a method for producing a thyristor in accordance with a sixth exemplary embodiment of the invention. The method for producing the thyristor 660 differs from the method described in connection with FIG. 6A in that the third body region 678 of the thyristor 660 is both p-doped and n-doped. To put it another way, the central region (i.e. the third body region 678) of the thyristor 660 that is formed between the intrinsic body regions 604 and 605 is formed as a region in which a p-type implantation (or p-type doping) and an n-type implantation (or n-type doping) fully or at least partially compensate for one another, to put it another way as a region having opposite dopant types or counter-doped region (represented by "P/N" in FIG. 6D). The third body region 678 is doped with the aid of a halo implantation method and/or with the aid of an HDD implantation method (P+/N+ implantation), in which case the first gate region 606 and the second gate region 606' can serve as a mask, such that a self-alignment of the body regions can be achieved.

The structure 660 shown in FIG. 6D is like the structure of a pin diode, which pin diode at breakdown exhibits a similar behavior to an SCR. One effect of the structure 660 shown can be seen in the self-alignment. If, in addition, both p-type and n-type halo implantations and p-type and n-type HDD implantations are used for doping the third body region 678 (that is to say simultaneous halo doping and HDD doping of the third body region 678), common halo and HDD masks can be used in the production of the thyristor 660. In other words, a first common mask can be used for an n-type halo implantation and an n-type HDD implantation, and a second common mask can be used for a p-type halo implantation and a p-type HDD implantation. The number of masks used is thus identical to the number of masks used in a standard process, that is to say that no additional masks are required.

The thyristor 660, like the thyristors 600, 620 and 640 described above, can be produced with the aid of an SOI technology (e.g. an FD-SOI technology) or a MuGFET technology.

Figure 7A:
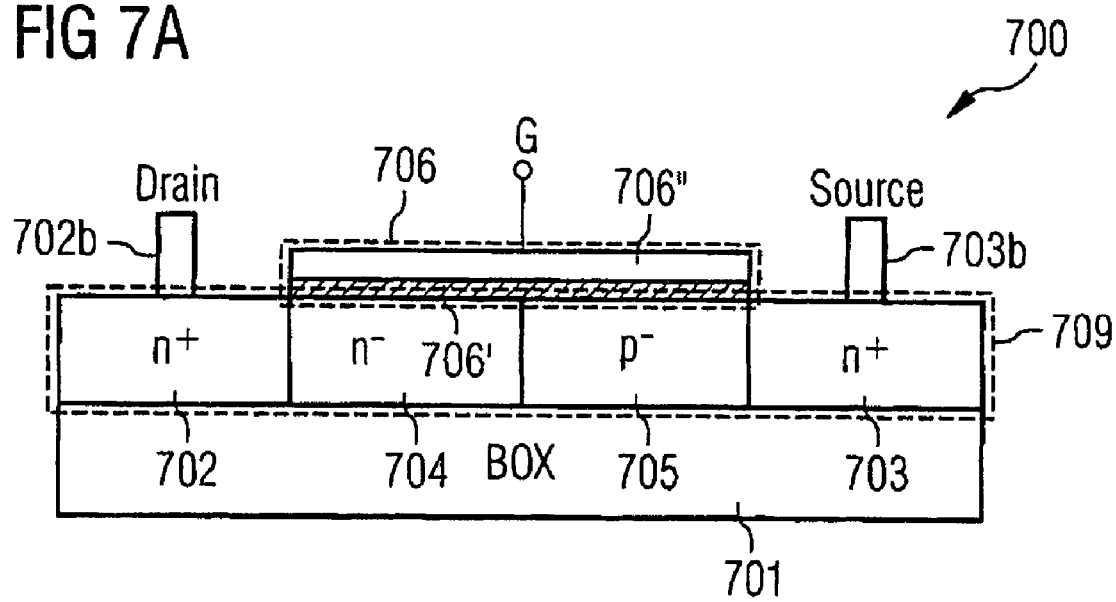
FIG. 7A shows a drain-extended MOS field-effect transistor in accordance with a seventh exemplary embodiment of the invention.

FIG. 7A shows a cross-sectional view of a drain-extended MOS field-effect transistor (DE-MOS-FET) 700 in accordance with a seventh exemplary embodiment of the invention. The DE-MOS-FET 700 has a fin structure 709 formed on a buried oxide layer (BOX) 701. The oxide layer 701 can be formed on a semiconductor substrate such as e.g. a silicon substrate (not shown). The fin structure 709 or fin 709 can have silicon material. In an alternative configuration (not shown) of the invention, the drain-extended MOS field-effect transistor 700 can have a silicon-on-insulator Structure (SOI structure), e.g. an SOI structure fully depleted of charge carriers (Fully Depleted SOI, FD-SOI).

The fin structure 709 has a heavily n-doped (N+) first connection region 702 and a heavily n-doped (N+) second connection region 703. The doping of the first connection region 702 and/or of the second connection region 703 can be effected with the aid of an ion implantation method such as e.g. an HDD implantation method (Highly Doped Drain) or a source/drain implantation method, in which case a dopant concentration of approximately greater than $10^{20}$ cm$^{-3}$ can be achieved in the first connection region 702 and/or in the second connection region 703.

Electrical contact can be made with the first connection region 702 by means of a first electrical contact 702b formed on the first connection region 702, and electrical contact can be made with the second connection region 703 by means of a second electrical contact 703b formed on the second connection region 703. In an alternative configuration (not shown) of the invention, the first connection region 702 and/or the second connection region 703 can be silicided (that is to say a silicide layer can be formed on the respective connection region or in an upper partial region of the respective connection region), such that it is possible to reduce the contact resistance between the first electrical contact 702b and the first connection region 702, and between the second electrical contact 703b and the second connection region 703.

The first connection region 702 and the first electrical contact 702b clearly serve as a drain region (identified by "Drain" in FIG. 7A) of the drain-extended MOS field-effect transistor 700, while the second connection region 703 and the second electrical contact 703b clearly serve as a source region (identified by "Source" in FIG. 7A) of the DE-MOS-FETs 700.

A weakly n-doped (N−) first body region 704 and a weakly p-doped (P−) second body region 705 are formed between the first connection region 702 and the second connection region 703, the first body region 704 being formed between the first connection region 702 and the second body region 705 and the second body region 705 being formed between the first body region 704 and the second connection region 703.

The doping of the first body region 704 and/or of the second body region 705 can be effected with the aid of an ion implantation method such as e.g. a Vt implantation method, in which case a dopant concentration of approximately $10^{17}$ cm$^{-3}$ to $10^{18}$ cm$^{-3}$ can be achieved in the first body region 704 and/or in the second body region 705.

A gate region 706 is formed on or above the first body region 704 and the second body region 705. The gate region 706 has an electrically insulating layer (gate dielectric) 706' formed on the first body region 704 and the second body region 705 (e.g. a gate oxide), and also an electrically conductive layer 706" formed on the electrically insulating layer 706' (conductive gate layer e.g. made of polysilicon, a metal or some other suitable electrically conductive material).

The gate 706 can be formed on or above the first body region 704 and the second body region 705 in such a way that the first body region 704 and the second body region 705 can be driven from the two lateral faces of the fin 709 (double-gate structure). As an alternative, the gate 706 can be formed in such a way that the first body region 704 and the second body region 705 can be driven from the two lateral faces and the top face of the fin 709 (triple-gate structure or multi-gate structure).

The drain-extended MOS field-effect transistor 700 shown in FIG. 7A is formed as a drain-extended NMOS field-effect transistor (DE-NMOS-FET), that is to say as an N-channel MOS field-effect transistor having a laterally extended drain region. In this case, the lightly doped (N−) first body region 704 formed below the gate 706 clearly serves as an extension of the drain region formed from the highly doped (N+) first connection region 702.

The doping of the first connection region 702 and/or of the second connection region 703 can be effected after the formation of the gate region 706. In this case, the gate 706 clearly serves as a mask during the HDD doping of the connection regions 702 and 703. In this way, it is possible to achieve a self-alignment of the drain region (or of the highly doped (N+) first connection region 702) and/or of the extended drain region (i.e. of the lightly doped (N−) first body region 704). The drain-extended MOS field-effect transistor 700 clearly has a self-aligned device structure in this case.

Figure 7B:
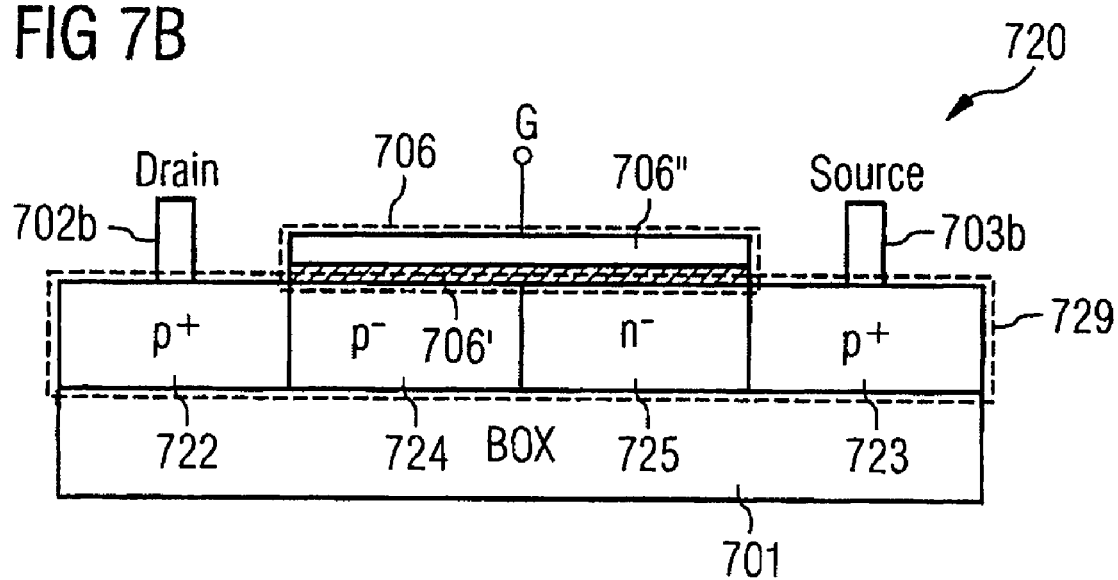
FIG. 7B shows a drain-extended MOS field-effect transistor in accordance with an eighth exemplary embodiment of the invention.

FIG. 7B shows a cross-sectional view of a drain-extended MOS field-effect transistor (DE-MOS-FET) 720 in accordance with an eighth exemplary embodiment of the invention. The DE-MOS-FET 720 differs from the DE-MOS-FET 700 shown in FIG. 7A by virtue of the fact that a fin structure 729 of the DE-MOS-FET 720 has a heavily p-doped (P+) first connection region 722 and a heavily p-doped (P+) second connection region 723, and also a weakly p-doped (P−) first body region 724 and a weakly n-doped (N−) second body region 725, the first body region 724 and the second body region 725 being formed between the first connection region 722 and the second connection region 723 in such a way that the first body region 724 is formed between the first connection region 722 and the second body region 725, and that the second body region 725 is formed between the first body region 724 and the second connection region 723.

The DE-MOS-FET 720 is clearly formed as a drain-extended PMOS field-effect transistor (DE-PMOS-FET), that is to say as a P-channel MOS field-effect transistor having a laterally extended drain region, the weakly p-doped (P−) first body region 724 serving as an extension of the drain region (identified by "drain" in FIG. 7B) of the transistor 720, said drain region being formed from the first connection region 722 (and the first electrical contact 702b). The drain-extended PMOS field-effect transistor (DE-PMOS-FET) can be produced using similar process steps to the manner already described in connection with FIG. 7A.

FIG. 8A shows a cross-sectional view of a drain-extended MOS field-effect transistor (DE-MOS-FET) 800 in accordance with a ninth exemplary embodiment of the invention. The DE-MOS-FET 800 is formed as a drain-extended NMOS field-effect transistor (DE-NMOS-FET) and differs from the DE-MOS-FET (or DE-NMOS-FET) 700 shown in FIG. 7A by virtue of the fact that, in the case of the DE-NMOS-FET 800, a gate region 806 electrically coupled to a gate connection G (which gate region 806 has an electrically insulating layer 806' and an electrically conductive layer 806" formed on the electrically insulating layer 806') is formed on or above the second body region 705 and on or above a first partial region of the first body region 704. In other words, the gate region 806 is only formed on or above a first partial region of the first body region 704, such that a second partial region (identified by the double arrow 808 in FIG. 8A) having the length Z (measured along the longitudinal axis of the fin structure 709) of the first body region 704 is not covered by the gate region 806. The value for the maximum permissible drain voltage can be increased with the aid of the distance Z since a voltage drop occurs along the more lightly doped (N−) first body region 704. Generally, in the case of a DE-MOS transistor, it is necessary to restrict the maximum voltage dropped across a gate oxide. With an increasing value of the parameter Z (=length of that section of the first body region 704 which is not covered by the gate region 806), it is possible to increase the value for the maximum value. In other words, as value Z increases, higher maximum voltage drops between gate and drain are possible. The length Z can be approximately 50 mm to 2000 nm.

The alignment of the drain region (or of the highly doped (N+) first connection region 702) and/or of the extended drain region (i.e. of the lightly doped (N−) first body region 704) can be achieved with the aid of a mask in the case of the DE-NMOS-FET 800. The drain-extended NMOS field-effect transistor 800 clearly has a mask-aligned device structure in this case.

As in the case of the exemplary embodiments described in connection with FIG. 7A and FIG. 7B, the first connection region 702 and/or the second connection region 703 of the DE-MOS-FET 800 can be silicided. A silicide layer can be formed after the formation of the gate 806, in which case a siliciding of the second partial region of the first body region 704, said second partial region not being covered by the gate 806, can be blocked for example with the aid of a mask, as is represented by the region 810 in FIG. 8A.

FIG. 8B shows a cross-sectional view of a drain-extended MOS field-effect transistor (DE-MOS-FET) 820 in accordance with a tenth exemplary embodiment of the invention. A DE-MOS-FET 820 differs from the DE-MOS-FET 800 shown in FIG. 8A by virtue of the fact that the DE-MOS-FET 820 is formed as a drain-extended PMOS field-effect transistor 820, i.e. as a P-channel MOS field-effect transistor having a laterally extended drain region. In this case, the weakly p-doped (P−) first body region 724 forms an extension of the drain of the transistor 820, said drain being formed from the heavily p-doped (P+) first connection region 722.

FIG. 9A shows a layout illustration of an electronic component arrangement 900' formed as a field-effect transistor arrangement based on a MuGFET technology in accordance with an eleventh exemplary embodiment of the invention. The field-effect transistor arrangement 900' has a multi-fin structure 908 having a plurality of parallel-connected drain-extended NMOS field-effect transistors (DE-NMOS-FETs) 900, each DE-NMOS-FET 900 having a fin structure 909. Each fin 909 has a heavily n-doped (N+) first connection region 702 and a heavily n-doped (N+) second connection region 703, and also a weakly n-doped (N−) first body region 704 and a weakly p-doped (N−) second body region 705. The weakly n-doped (N−) first body region 704 and the weakly p-doped (P−) second body region 705 are formed between the heavily n-doped (N+) first connection region 702 and the heavily n-doped (N+) second connection region 703 in such a way that the weakly n-doped (N−) first body region 704 is formed between the heavily n-doped (N+) first connection region 702 and the weakly p-doped (P−) second body region 705, and that furthermore the weakly p-doped (P−) second body region 705 is formed between the weakly n-doped (N−) first body region 704 and the heavily n-doped (N+) second connection region 703. The fin structures 909 therefore have a similar structure to the fin structures 709 and 809 shown in FIG. 7A and FIG. 8A, respectively.

Electrical contact is made jointly with the first connection regions 702 of the fin structures 909 by means of a plurality of first electrical contacts 702b, and electrical contact is made jointly with the second connection regions 703 by means of a plurality of second electrical contacts 703b. The first connection regions 702 together with the first electrical contacts 702b form a drain region (designated by "drain" in FIG. 9) of the field-effect transistor arrangement 900', while the second connection regions 703 together with the second electrical contacts 703b form a source region (designated by "source" in FIG. 9) of the field-effect transistor arrangement 900'.

The multi-fin structure 908 of the field-effect transistor arrangement 900' has a gate region or gate (identified by the gate electrode 906 in FIG. 9), which gate 906 is formed on or above the weakly p-doped (P−) second body regions 705 and on or above a first partial region of the weakly n-doped (N−) first body region 704 of each individual one of the parallel-connected DE-NMOS-FETs 900 (or the respective fin structures 909). In other words, the DE-NMOS-FETs 900 formed in the field-effect transistor arrangement 900' have a common gate 906 that is clearly wound over the fin structures 909 of the multi-fin structure 908. In this case, the gate 906 can be set up in the manner described for example in connection with the drain-extended NMOS field-effect transistor 800 shown in FIG. 8A. The gate 906 furthermore has an electrical connection G, it being possible for electrical contact to be made with the gate 906 by means of said connection G.

The highly doped (N+) connection regions 702 and 703 of the field-effect transistor arrangement 900' can be formed as mask-aligned regions. Furthermore, the first connection region 702 and/or the second connection region 703 can be silicided in order to reduce a contact resistance between the electrical contacts 702b and 703b and the connection regions 702 and 703, respectively, in which case the siliciding can be blocked in the identified region 910 (for example with the aid of a mask).

In an alternative configuration (not shown) of the invention, the gate 906 can also cover the respective first body region 704 of each DE-NMOS-FET 900 (or the corresponding fin structure 909) (cf. FIG. 7A), and the highly doped (N+) connection regions 702 and 703 can be formed as self-aligned regions. Furthermore, in the field-effect transistor arrangement 900', a plurality of DE-PMOS-FETs (such as e.g. the DE-PMOS-FETs 720 and 820 shown in FIG. 7B and FIG. 8B, respectively) can be connected in parallel instead of DE-NMOS-FETs.

A description is given below, with reference to FIGS. 10A to 10E, of various process steps of a method for producing an electronic component in accordance with a twelfth exemplary embodiment of the invention, the electronic component being formed by way of example as a thyristor in an FD-SOI technology.

Figure 10A:
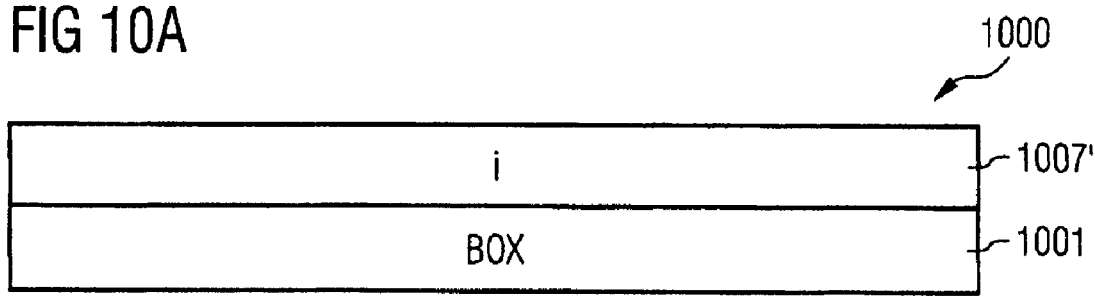
FIGS. 10A to 10F show various process steps of a method for producing an electronic component in accordance with a twelfth exemplary embodiment of the invention.

FIG. 10A shows the electronic component or the thyristor 1000 during a first process step of the method, in which a Buried Oxide Layer (BOX) 1001 is formed in a semiconductor substrate (silicon substrate). The substrate has an intrinsic conductivity, such that a layer 1007' having intrinsic conductivity (intrinsic layer 1007') is formed above the buried oxide layer 1001.

Figure 10B:
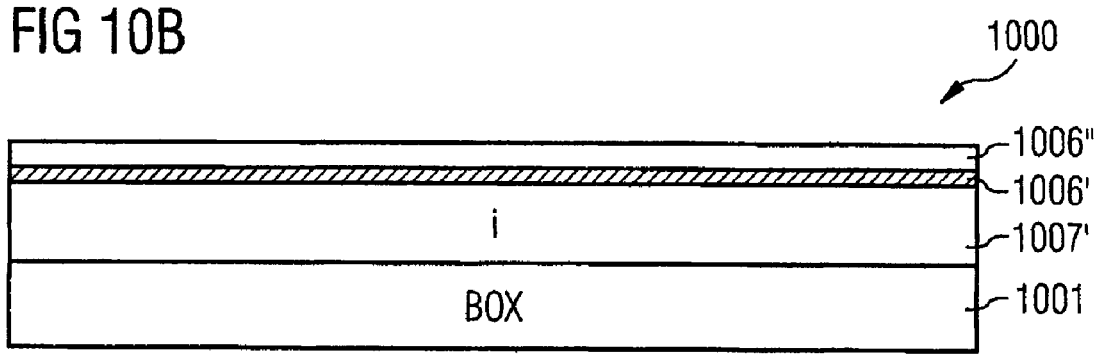

FIG. 10B shows the thyristor 1000 during another process step of the method, in which an electrically insulating layer (gate dielectric) 1006', e.g. an oxide layer (gate oxide) is formed on the intrinsic layer 1007' and an electrically conductive gate layer 1006" (e.g. made of polysilicon, a metal or some other suitable electrically conductive material) is formed on the electrically insulating layer 1006'.

Figure 10C:
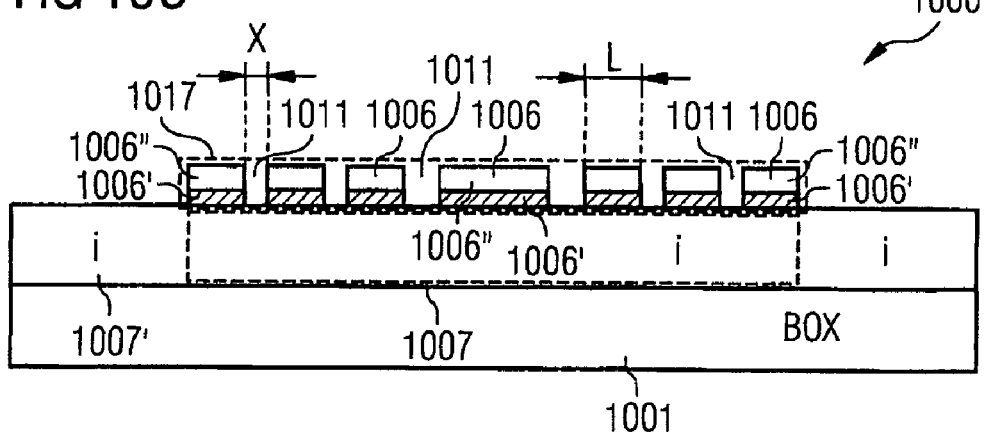

FIG. 10C shows the thyristor 1000 during another process step of the method, in which material of the electrically insulating layer 1006' and of the electrically conductive layer 1006" is removed in such a way that a plurality of gate regions 1006 separate from one another are formed on or above the intrinsic layer 1007'. In other words, a plurality of gate regions 1006 separate from one another are formed by means of patterning the electrically insulating layer 1006' and the electrically conductive layer 1006" (for example using a lithography method and an etching method), the gate regions 1006 being formed on or above a partial region of the intrinsic layer 1007', which partial region 1007 clearly serves as body region 1007 of the thyristor 1000.

The gate regions 1006 are separated from one another by intermediate regions 1011, no gate material being formed in said intermediate regions 1011. From the standpoint of clear consideration, partial regions of the intrinsic layer 1007' remain free.

The separate gate regions 1006 can be formed in such a way that two adjacent gate regions 1006 have a distance X, which may for example be less than the minimum feature size F of the technology used. The distance X may be a few 10 nm, for example 15 nm to 60 nm.

Furthermore, the separate gate regions 1006 can be formed in such a way that one or a plurality of the gate regions 1006 has a length L, which length L may for example be less than the minimum feature size F of the technology used. The length L of the gate region 1006 may be 5 nm to 200 nm, for example a few 10 nm, for example 15 nm to 60 nm.

The gate regions 1006 together with the intermediate regions 1011 clearly form a slotted gate mask 1017 or a slotted gate 1017. In the exemplary embodiment shown, the gate mask 1017 has seven gate regions 1006 separated from one another by interspaces, in which case one central gate region 1006 can have a length of typically greater than 2L, while the other six gate regions have the length L. Furthermore, in each case two adjacent gate regions 1006 have a distance X.

The structure of the slotted gate mask 1017 that is shown in FIG. 10C, i.e. the number, size and distance of the gate regions 1006 and interspaces 1011, is by way of example. As an alternative, the gate mask 1017 can have a different slot structure.

Figure 10D:
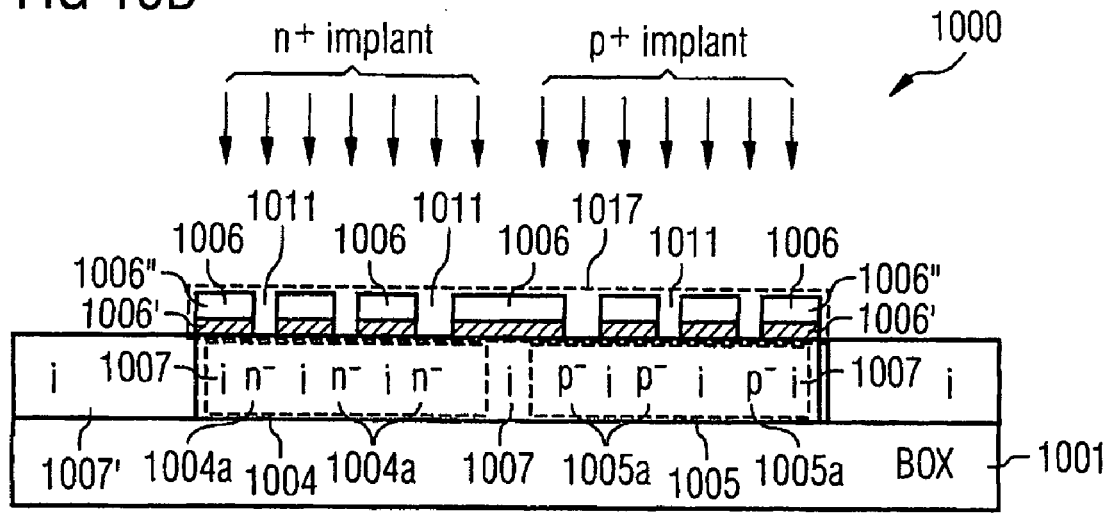

FIG. 10D shows the thyristor 1000 during another process step of the method, in which the free partial regions (that is to say the partial regions formed below the intermediate regions 1011) of the (intrinsic) body regions 1007 are doped by means of introducing dopant atoms. In this case, the dopants are introduced through the interspaces 1011 formed between the separate gate regions 1006. In the exemplary embodiment shown, the doping is effected with the aid of an HDD implantation method, a plurality of first weakly n-doped (N−) partial regions 1004a being formed by means of an N+-type implantation (identified by "N+ implant" in FIG. 10D) in a first half of the (intrinsic) body region 1007, said first half being adjacent to a (subsequently formed, cf. FIG. 10E) first connection region 1002, and a plurality of second weakly p-doped (P−) partial regions 1005a being formed by means of P+-type implantation (identified by "P+ implant" in FIG. 10D) in a second half of the (intrinsic) body region 1007, said second half being adjacent to a (subsequently formed, cf. FIG. 10E) second connection region 1003.

Clearly, the doping of the intrinsic layer 1007' or of the (intrinsic) body region 1007 formed in the intrinsic layer 1007' (more precisely of the first partial regions 1004a and of the second partial regions 1005a) is effected through the slotted gate mask 1017, the doping being blocked directly below the gate regions 1006. In other words, the (intrinsic) body region 1007 is only locally doped (below the intermediate regions 1011), or the dopant atoms are only locally implanted (into the uncovered partial regions 1004a and 1005a of the (intrinsic) body region 1007).

On account of a dopant concentration gradient that forms in the (intrinsic) body region 1007 between the doped partial regions 1004a and 1005a and the adjoining undoped partial regions of the (intrinsic) body region 1007, an outdiffusion of the dopant atoms introduced into the (intrinsic) body region 1007 can occur. In other words, the dopant profiles of the doped partial regions for 1004a and 1005a can also extend into the masked partial regions below the gate regions 1006. By means of the lateral outdiffusion of the dopant atoms, clearly a diluted weakly n-doped first body partial region 1004 and a diluted weakly p-doped second body partial region 1005 can be formed alongside one another in the intrinsic body region 1007. The diluted weakly doped body partial regions 1004 and 1005 are also referred to as "diluted body regions". Clearly, the first body partial region 1004 has a patterned or diluted n-type implantation, and the second body partial region 1005 has a patterned or diluted p-type implantation.

Figure 10E:
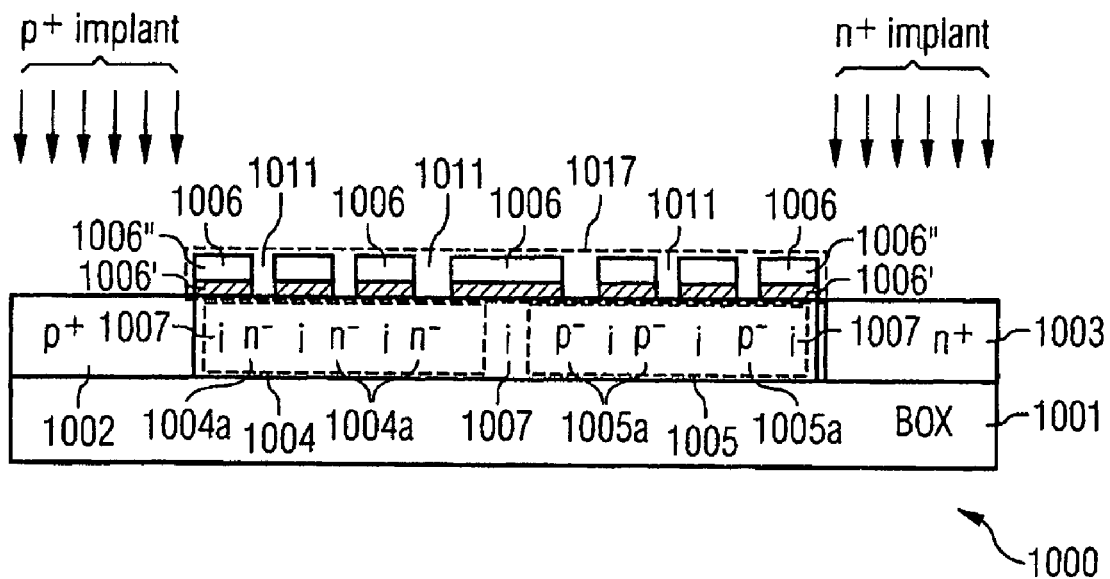

FIG. 10E shows the thyristor 1000 during another process step of the method, in which a first connection region 1002 and a second connection region 1003 are formed in the intrinsic layer 1007'. The first connection region 1002 is formed as a heavily p-doped (P+) region 1002, and the second connection region 1003 is formed as a heavily n-doped (N+) region. In the exemplary embodiment shown, the doping of the first connection region 1002 and of the second connection region 1003 is in each case effected with the aid of an HDD implantation method (identified by "P+ implant" and "N+ implant" in FIG. 10E), in which case the gate regions 1006 can serve as a mask during the doping or implantation of the dopant atoms.

The dopant concentration in the first connection region 1002 and/or in the second connection region 1003 may be approximately greater than $10^{20}$ cm$^{-3}$.

Figure 10F:
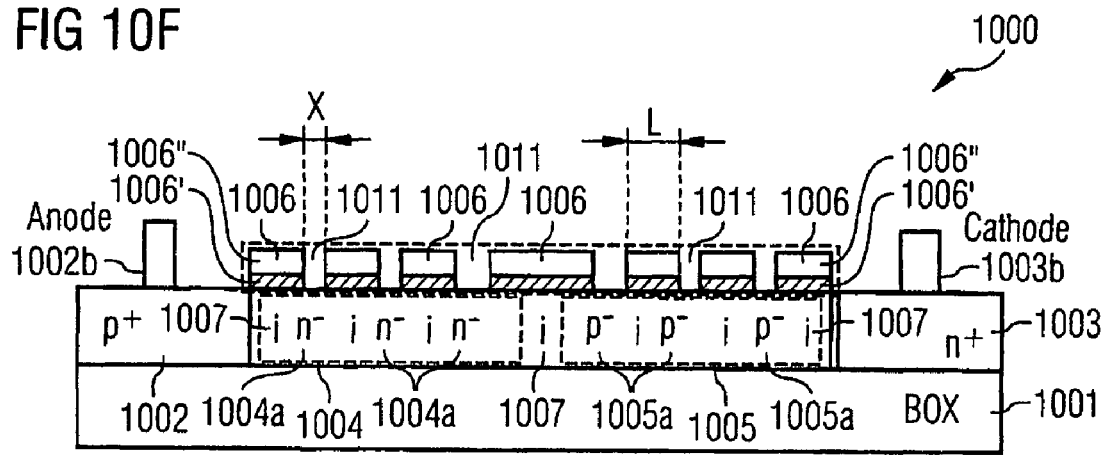

FIG. 10F shows the thyristor 1000 during another process step of the method, in which a first electrical contact 1002b is formed on the first connection region 1002, and in which a second electrical contact 1003b is furthermore formed on the second connection region 1003. Electrical contact can be made with the first connection region 1002 by means of the first electrical contact 1002b and said first connection region clearly forms an anode of the thyristor 1000 (identified by "anode" in FIG. 10F). Correspondingly, electrical contact can be made with the second connection region 1003 by means of the second electrical contact 1003b and said second connection region clearly forms a cathode of the thyristor 1000 (identified by "cathode" in FIG. 10F).

The gate regions 1006 can be formed as potential-free gate regions 1006 (electrically floating gates). As an alternative, electrical contact can be made with one or more of the gate regions 1006 (for example by means of one or more electrical gate connections, cf. FIG. 11) and said one or more of said gate regions can be used for example as control gates for improved triggering of the thyristor 1000.

Figure 11:
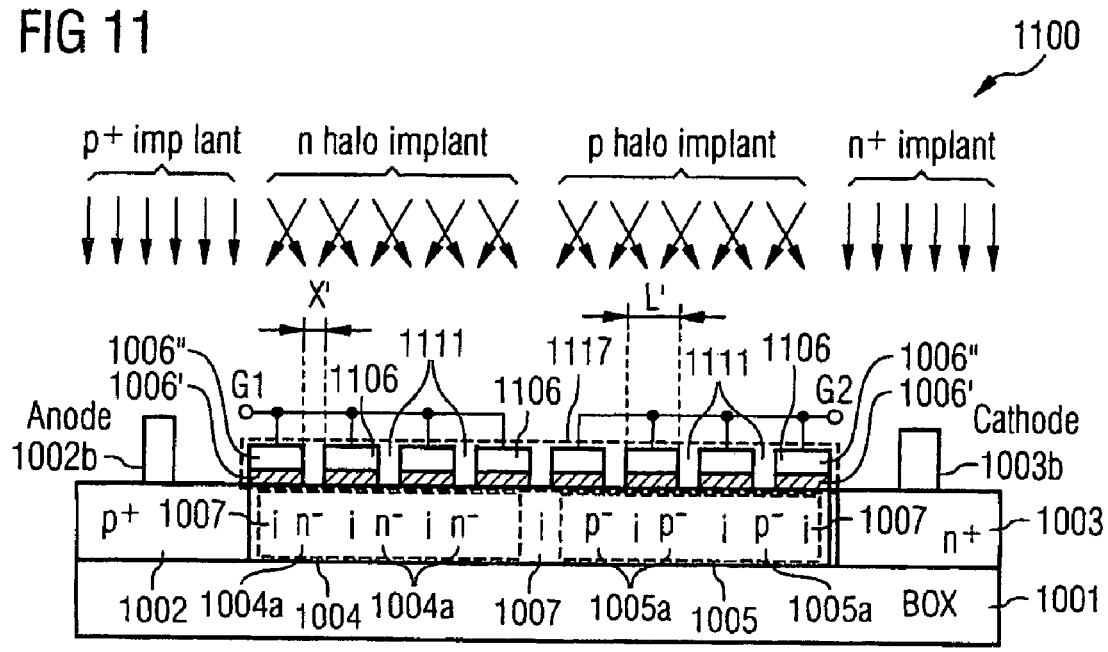
FIG. 11 shows a thyristor produced by means of a method for producing an electronic component in accordance with a thirteenth exemplary embodiment of the invention.

FIG. 11 shows a cross-sectional view of a thyristor 1100 produced by means of a method for producing an electronic component in accordance with a thirteenth exemplary embodiment of the invention. The method initially has essentially the same process steps as described in connection with FIGS. 10A to 10C, wherein in contrast to the thyristor structure 1000 shown in FIG. 10C, in the case of the thyristor 1100 shown in FIG. 11, a plurality of gate regions 1106 separate from one another are formed in such a way that all the gate regions 1106 have approximately the same length L', and that furthermore two adjacent gate regions 1106 in each case have a distance X'. The values for the length L' and the distance X' may be the same order of magnitude as was described in connection with FIG. 10C for the length L and the distance X. The gate regions 1106 are separated from one another by intermediate regions 1111.

In the method for producing the thyristor 1100, in a process step analogous to the process step shown in FIG. 10D, the uncovered partial regions (that is to say the partial regions formed below the intermediate regions 1111) of the intrinsic body region 1007 are doped by means of introducing dopant atoms, the dopants being introduced through the interspaces formed between the separate gate regions 1006. In contrast to the process step shown in FIG. 10D, in accordance with the exemplary embodiment of the method that is described here, the doping is effected with the aid of a halo implantation method, the plurality of first weakly n-doped (N–) partial regions 1004a being formed by means of an n-type halo implantation (identified by "N halo implant" in FIG. 11) in the first half of the (intrinsic) body region 1007, said first half being adjacent to the first connection region 1002, and the plurality of second weakly p-doped (P–) partial regions 1005a being formed by means of a p-type halo implantation (identified by "P halo implant" in FIG. 11) in the second half of the (intrinsic) body region 1007, said second half being adjacent to the second connection region 1003.

The doping of the intrinsic body region 1007 or of the partial regions 1004a and 1005a is clearly effected by means of introducing halo implants through a slotted gate mask 1117, whereby a diluted weakly n-doped first body partial region ("diluted body region") 1004 and a diluted weakly p-doped second body partial region 1005 are formed alongside one another in the intrinsic body region 1007 of the thyristor 1100, as described above in connection with FIG. 10D.

The halo implants or the halo implantation can be introduced at an implantation angle of 5° to 80°, for example. Clearly, the dopant atoms impinge obliquely on the surface of the body region 1007. On account of a shading effect of the gate regions 1106 or the gate stack during an oblique implantation, the use of a halo implantation method is particularly effective for forming the diluted body partial regions 1004 and 1005.

In another process step of the method, which process step is analogous to the process step shown in FIG. 10E, the heavily p-doped (P+) first connection region 1002 is formed by means of a P+-type implantation (identified by "P+ implant" in FIG. 11), and the heavily n-doped (N+) second connection region 1003 is formed by means of an N+-type implantation (identified by "N+ implant" in FIG. 11).

In another process step of the method, a first electrical contact 1002b is formed on the first connection region 1002, and a second electrical contact 1003b is formed on the second connection region 1003. Electrical contact can be made with the first connection region 1002 by means of the first electrical contact 1002b and said first connection region clearly forms an anode of the thyristor 1100 (identified by "anode" in FIG. 11). Correspondingly, electrical contact can be made with the second connection region 1003 by means of the second electrical contact 1003b and said second connection region clearly forms a cathode of the thyristor (identified by "cathode" in FIG. 11).

In another process step of the method, electrical contact is made jointly with the gate regions 1006 formed above the diluted weakly n-doped first body partial region 1004 of the thyristor 110 by means of a first electrical gate connection G1, and electrical contact is made jointly with the gate regions 1106 formed above the diluted weakly p-doped second body partial region 1005 of the thyristor 1100 by means of a second electrical gate connection G2. By means of applying a first electrical potential to the gate regions 1106 formed above the diluted weakly n-doped first body partial region 1004 and/or by means of applying a second electrical potential to the gate regions 1106 formed above the diluted weakly p-doped second body partial region 1005, it is possible to control the surface potential of the diluted weakly n-doped body region 1004 and/or the surface potential of the diluted weakly p-doped body region 1005, whereby improved triggering of the thyristor 1100 can be achieved, for example.

A description is given below, with reference to FIGS. 12A to 12D, of various process steps of a method for producing an electronic component in accordance with a fourteenth exemplary embodiment of the invention, the electronic component being formed by way of example as a drain-extended MOS field-effect transistor (DE-MOS-FET) in a MuGFET technology.

Figure 12A:
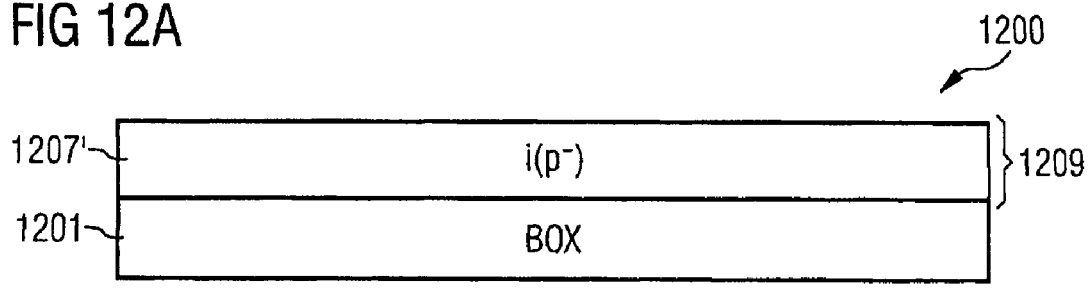

FIG. 12A shows the electronic component or the drain-extended MOS field-effect transistor (DE-MOS-FET) 1200 during a first process step of the method, in which a Buried Oxide Layer (BOX) 1201 is formed in a semiconductor substrate (e.g. a silicon substrate, not shown). The substrate can have an intrinsic conductivity. As an alternative, the substrate can be formed as a weakly p-doped substrate, e.g. having a dopant concentration of less than approximately $10^{16}$ cm$^{-3}$. A layer 1207' is therefore formed above the buried oxide layer 1201, which layer 1207' can have an intrinsic conductivity or alternatively can be weakly p-doped (P−) (identified by "i (P−)" in FIG. 12A). It is assumed in the description below that the layer 1207' is formed as an intrinsic layer. The layer 1207' is patterned in such a way that it has a fin structure 1209.

Figure 12B:
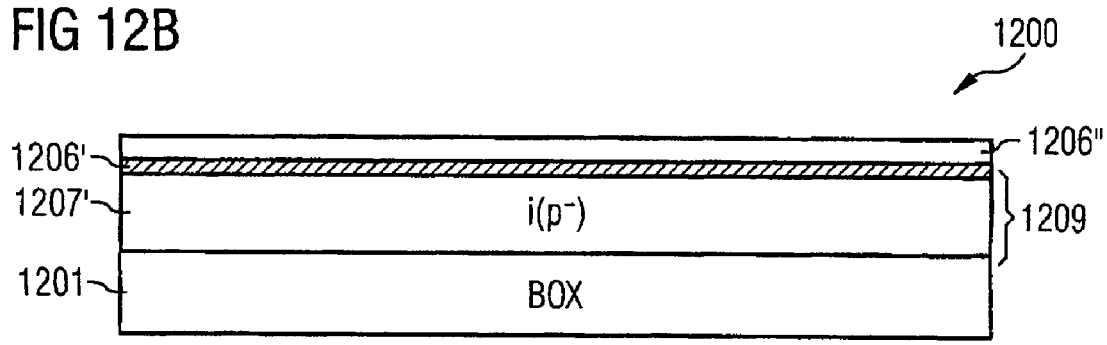

FIG. 12B shows the DE-MOS-FET 1200 during another process step of the method, in which an electrically insulating layer (gate dielectric) 1206', e.g. an oxide layer (gate oxide), is formed on the intrinsic layer 1207' or the fin structure 1209, and an electrically conductive gate layer 1206" (e.g. made of polysilicon, a metal or some other suitable electrically conductive material) is formed on the electrically insulating layer 1206'.

Figure 12C:
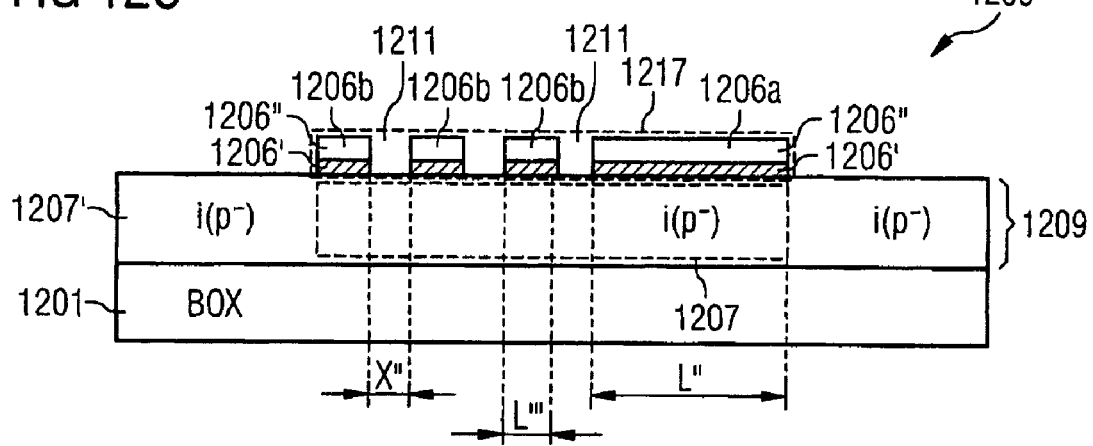

FIG. 12C shows the DE-MOS-FET 1200 during another process step of the method, in which material of the electrically insulating layer 1206' and of the electrically conductive gate layer 1206" is removed in such a way that a plurality of gate regions 1206a and 1206b separate from one another are formed on or above the intrinsic layer 1207'. In other words, a plurality of gate regions 1206a and 1206b separate from one another are formed by means of patterning the electrically insulating layer 1206' and the electrically conductive layer 1206" (for example using a lithography method and an etching method), the gate regions 1206a and 1206b being formed on or above a partial region of the intrinsic layer 1207', which partial region clearly serves as a body region 1207 of the DE-MOS-FET 1200. A first gate region 1206a having a length L" and also a plurality of second gate regions 1206b, which second gate regions have a length L''', are formed in accordance with the exemplary embodiment shown.

The gate regions 1206a and 1206b are separated from one another by intermediate regions 1211, no gate material being formed in said intermediate regions 1211. The removal of the gate material clearly uncovers partial regions of the (intrinsic) layer 1207' which were concealed by the electrically insulating layer 1206' and the electrically conductive layer 1206".

The separate gate regions 1206a, 1206b can be formed in such a way that two adjacent second gate regions 1206b and/or the first gate region 1206a and a second gate region 1206b adjacent to the first gate region 1206a have a distance X", which distance X" may for example be less than the minimum feature size F of the technology used. The distance X" may amount to a few 10 nm, for example 15 nm to 60 nm.

The first gate region 1206a can have a length L" that is customary for the respective technology used, for example minimum feature size F or greater (e.g. 30 nm to 600 nm).

Furthermore, the second gate regions 1206b can be formed in such a way that one or more of the second gate regions 1206b has a length L''', which length L''' may be for example less than the minimum feature size F of the technology used. The length L''' of a second gate region 1206b may amount to approximately 5 nm to 200 nm, for example a few 10 nm, for example 15 nm to 60 nm.

The first gate region 1206a and the second gate regions 1206b together with the intermediate regions 1211 clearly form a slotted gate mask 1217.

The structure of the slotted gate mask 1217 shown in FIG. 12C, i.e. the number, size and the distance of the gate regions 1206a, 1206b and the interspaces 1211, is by way of example. As an alternative, the gate mask 1217 can have a different slot structure.

FIG. 12D shows the DE-MOS-FET 1200 during another process step of the method, in which the uncovered partial regions (that is to say the partial regions formed below the intermediate regions 1211) of the intrinsic body region 1207 are doped by means introducing dopant atoms. The dopants are introduced through the interspaces 1211 formed between the separate gate regions 1206a and 1206b. In the exemplary embodiment, the doping is effected with the aid of a halo implantation method, a plurality of weakly n-doped (N−) partial regions 1204a being formed by means of an n-type halo implantation (identified by "N halo implant" in FIG. 12D) in a partial region of the body region 1207, said partial region being adjacent to a first connection region 1202 (not shown, cf. FIG. 12E).

Clearly, the doping of the body region 1207 (more precisely the partial regions 1204a) is effected through the slotted gate mask 1217, the doping being blocked below the first gate region 1206a and below the second gate regions 1206b. In other words, the body region 1207 is only locally doped (below the intermediate regions 1211), or the dopant atoms are only implanted locally (into the uncovered partial regions 1204a of the body region 1207).

On account of a dopant concentration gradient formed in the body region 1207 between the doped partial regions 1204a of the body region 1207 and the adjoining undoped partial regions of the body region 1207, an outdiffusion of the dopant atoms introduced into the body region 1207 can occur. In other words, the dopant profiles of the doped partial regions 1204a can extend into the masked partial regions below the second gate regions 1206b. By means of the lateral outdiffusion of the dopant atoms, a diluted weakly n-doped first body partial region 1204 ("diluted body region") is formed in the body region 1207. The diluted weakly n-doped first body partial region 1204 clearly has a patterned or diluted n-type implantation and serves as an extended drain region 1204 of the DE-MOS-FET 1200.

Below the first gate region 1206a, an intrinsic (or weakly p-doped) second body partial region 1205 remains in the body region 1207, which second body partial region 1205 clearly serves as channel region 1205 of the DE-MOS-FET 1200.

In accordance with the exemplary embodiment shown in FIG. 12D, halo implants are introduced only in the region of the slotted gate mask 1217 (as identified by "N halo implant"). As an alternative, a halo implantation can be effected over the entire device or DE-MOS-FET 1200, in which case halo implants can also be introduced into the partial regions of the intrinsic layer 1207' that are formed on the right and on the left alongside the body region 1207 (that is to say into the partial regions of the intrinsic layer 1207' which are to be formed as connection regions of the DE-MOS-FET 1200, cf. FIG. 12E).

FIG. 12E shows the DE-MOS-FET 1200 during another process step of the method, in which a heavily n-doped (N+) first connection region 1202 and a heavily n-doped (N+) second connection region 1203 are formed in the intrinsic (or weakly p-doped) layer 1207' by means of introducing dopant atoms. The doping of the first connection region 1202 and of the second connection region 1203 is effected with the aid of an HDD implantation method (Highly Doped Drain) or a source/drain implantation method (identified by "N+ implant" in FIG. 12E), wherein the first gate region 1206 and/or the second gate regions 1206b can serve as a mask. The dopant concentration in the first connection region 1202 and/or in the second connection region 1203 may be approximately more than $10^{20}$ cm$^{-3}$.

Figure 12F:
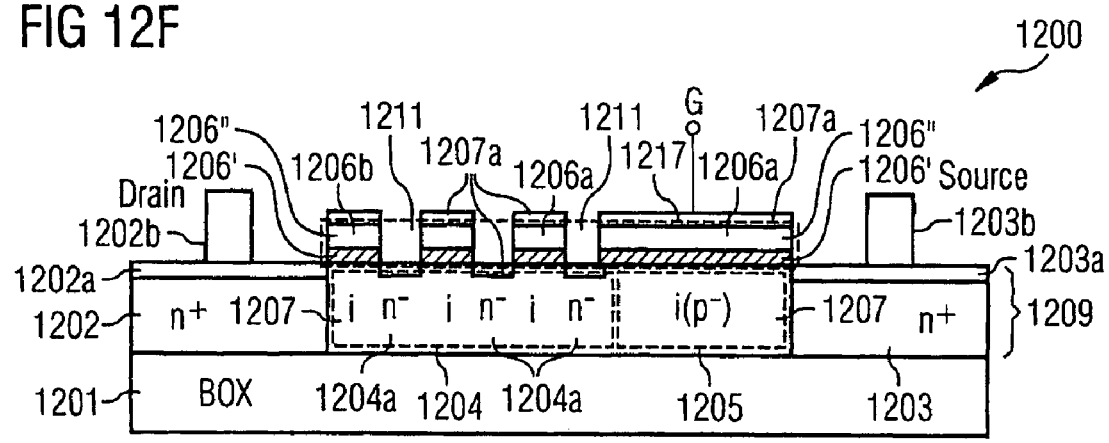

FIG. 12F shows the DE-MOS-FET 1200 during another process step of the method, in which the first connection region 1202 and the second connection region 1203 are silicided in such a way that a first silicide layer 1202a is formed on the first connection region 1202 (or in an upper partial region of the first connection region 1202) and that a second silicide layer 1203a is formed on the second connection region 1203 (or in an upper partial region of the second connection region 1203). Furthermore, a third silicide layer 1207a is formed on the slotted gate 1217 (that is to say on the first gate region 1206a and on the second gate regions 1206b) and also on or in the weakly n-doped partial regions 1204a, which weakly n-doped partial regions 1204a are formed below the intermediate regions 1211.

Furthermore, a first electrical contact 1202b is formed on the first silicide layer 1202a formed on the first connection region 1202, and a second electrical contact 1203b is formed on the second silicide layer 1203a formed on the second connection region 1203. Electrical contact is made with the heavily n-doped (N+) first connection region 1202 by means of the first electrical contact 1202b and said first connection region clearly forms a drain region of the DE-MOS-FET 1200 (identified by "drain" in FIG. 12F). Correspondingly, electrical contact can be made with the second connection region 1203 by means of the second electrical contact 1203b and said second connection region clearly forms a source region of the DE-MOS-FET 1200 (identified by "source" in FIG. 12F).

Electrical contact is made with the first gate region 1206a by means of an electrical gate connection G and said first gate region clearly serves as a gate 1206a of the DE-MOS-FET 1200.

The DE-MOS-FET 1200 has a heavily n-doped first connection region 1202 (drain), a heavily n-doped second connection region 1203 (source), an intrinsic (or weakly p-doped) channel region 1205, a gate 1206a and also an extended drain region 1204. The DE-MOS-FET 1200 is therefore clearly formed as an n-channel drain-extended MOS field-effect transistor 1200 or DE-NMOS-FET 1200.

Figure 13:
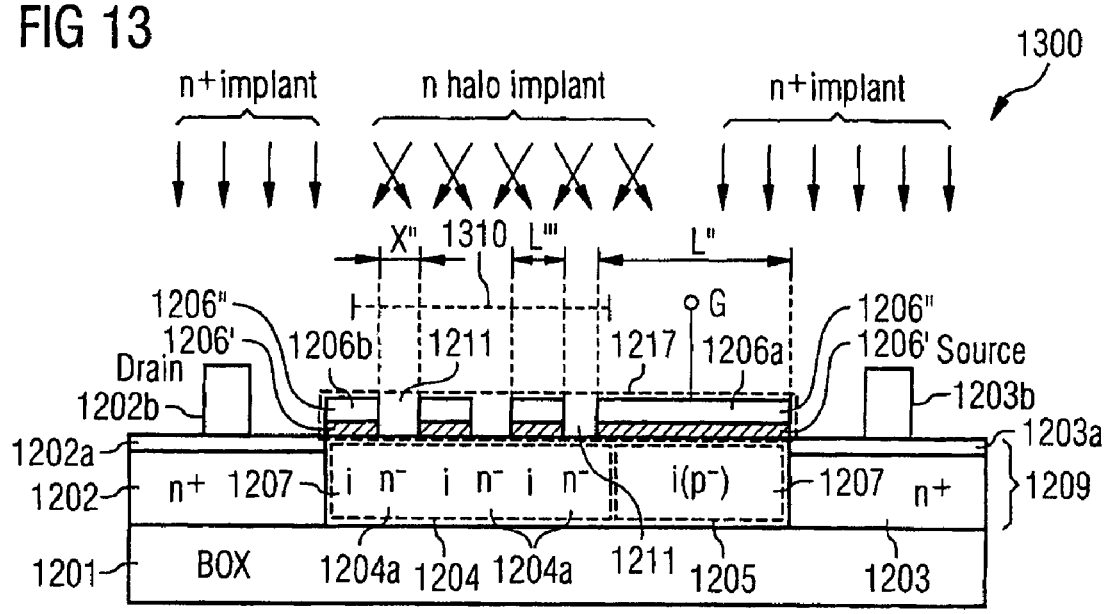
FIG. 13 shows a drain-extended MOS field-effect transistor produced by means of a method for producing an electronic component in accordance with a fifteenth exemplary embodiment of the invention.

FIG. 13 shows an N-channel drain-extended MOS field-effect transistor 1300 (DE-NMOS-FET 1300), that can be produced by means of a method for producing an electronic component in accordance with a fifteenth exemplary embodiment of the invention.

The method for producing the DE-NMOS-FET 1300 shown in FIG. 13 differs from the method described in connection with FIGS. 12A to 12F by virtue of the fact that the formation of the third silicide layer 1207a is prevented in the case of the DE-NMOS-FET 1300. In other words, clearly a siliciding of the extended drain region 1204 between the gate regions 1206a, 1206b or a siliciding of the doped partial regions 1204a formed below the intermediate regions 1211 is prevented or blocked, and a siliciding of the gates is practically blocked as well. FIG. 13 schematically illustrates the contour 1310 of the silicide-blocked region.

The siliciding can be blocked with the aid of a mask. Furthermore, a siliciding of the extended drain region 1204 can be blocked since no silicide forms in or below the very narrow openings 1211 of the gate mask 1217 (for example due to material properties, grain size, etc.). In other words, the interspaces 1211 can be so narrow that no silicide forms therein.

By virtue of the fact that a siliciding of the extended drain region 1204 is blocked, it is possible to avoid an undesirable electric current flow near the surface.

Figure 14:
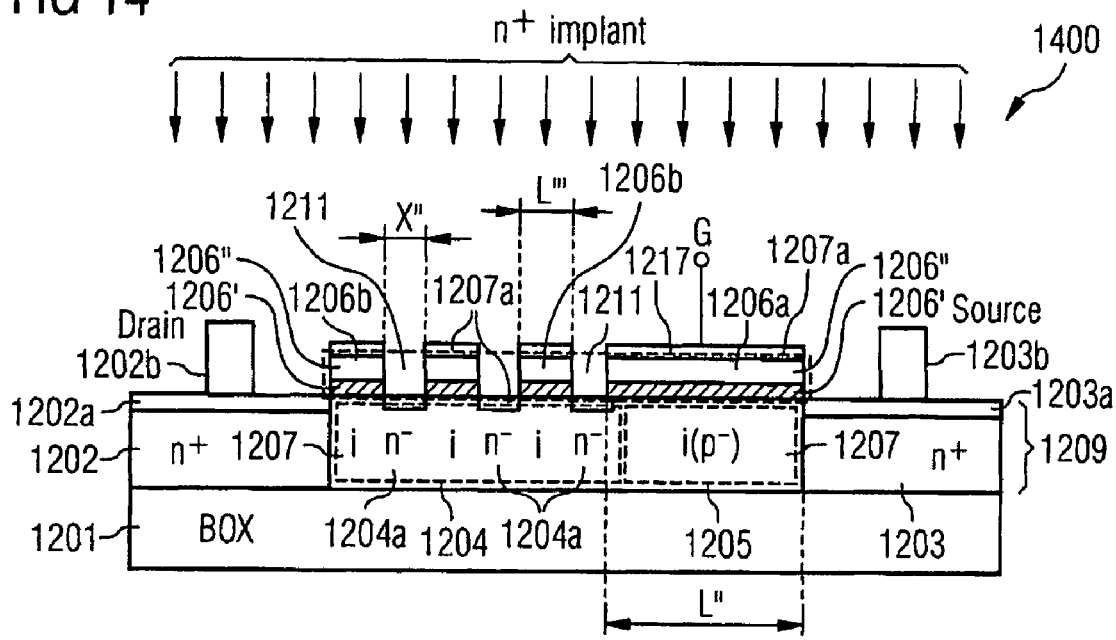
FIG. 14 shows a drain-extended MOS field-effect transistor produced by means of a method for producing an electronic component in accordance with a sixteenth exemplary embodiment of the invention.

FIG. 14 shows an N-channel drain-extended MOS-field effect transistor 1400 (DE-NMOS-FET 1400) that can be produced by means of a method for producing an electronic component in accordance with a sixteenth exemplary embodiment of the invention.

The method for producing a DE-NMOS-FET 1400 shown in FIG. 14 differs from the method described in connection with FIGS. 12A to 12F by virtue of the fact that both a halo implantation method and an HDD implantation method (or source/drain implantation method) are used for forming the weakly n-doped partial regions 1204a of the extended drain region 1204. In other words, in the exemplary embodiment shown, both N-halo implants (not shown, cf. FIG. 12D) and N+ implants (identified representatively by "N+ implant" in FIG. 14) are used for forming the weakly n-doped partial regions 1204a.

Figure 15:
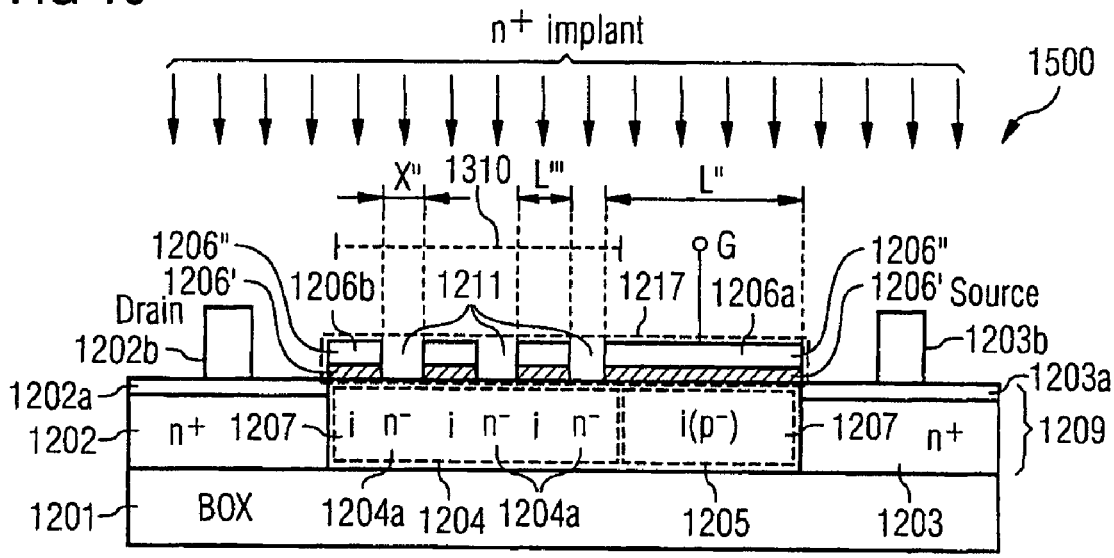
FIG. 15 shows a drain-extended MOS field-effect transistor produced by means of a method for producing an electronic component in accordance with a seventeenth exemplary embodiment of the invention.

FIG. 15 shows an N-channel drain-extended MOS field-effect transistor 1500 (DE-NMOS-FET 1500) that can be produced by means of a method for producing an electronic component in accordance with a seventeenth exemplary embodiment of the invention.

The method for producing the DE-NMOS-FET 1500 shown in FIG. 15 differs from the method described in connection with FIG. 14 by virtue of the fact that the formation of the third silicide layer 1207a is prevented in the case of the DE-NMOS-FET 1500. In other words, a siliciding of the extended drain region 1204 or the doped partial regions 1204a formed below the intermediate regions 1211 is prevented or blocked. FIG. 15 schematically illustrates the contour 1310 of the silicide-blocked region. The siliciding can be blocked with the aid of a mask. By virtue of the fact that a siliciding of the extended drain region 1204 is blocked, it is possible to avoid an undesirable electric current flow near the surface.

The drain-extended MOS field-effect transistors illustrated in FIG. 12F to FIG. 15 are formed as N-channel drain-extended MOS field-effect transistors (DE-NMOS-FETs). In alternative configurations (not shown) of a method for producing an electronic component, P-channel drain-extended MOS field-effect transistors (DE-PMOS-FETs) can also be formed in an analogous manner. Generally, it is possible to use a method for producing an electronic component both for NMOS structures and for PMOS structures.

Furthermore, all the abovementioned exemplary embodiments of the invention that are realized in a MuGFET technology can alternatively also be realized in a silicon-on-insulator technology (SOI technology).

What is claimed is:

1. A method for producing an electronic component, the method comprising:
   forming a first doped connection region and a second doped connection region on or above a substrate;
   forming a body region between the first doped connection region and the second doped connection region;
   forming at least two gate regions separate from one another on or above the body region; and
   doping at least one partial region of the body region by means of introducing dopant atoms, wherein the dopant atoms are introduced into the at least one partial region of the body region through at least one intermediate region formed between the at least two separate gate regions.

2. The method of claim 1, wherein the electronic component comprises a fin structure.

3. The method of claim 1, wherein the electronic component comprises a fully depleted silicon-on-insulator structure.

4. The method of claim 1, wherein the body region is formed as a region with intrinsic conductivity.

5. The method of claim 1, wherein the dopant atoms are introduced into the at least one partial region of the body region using an ion implantation method.

6. The method of claim 5, wherein one or more of the following ion implantation methods is or are used for introducing the dopant atoms:
a halo implantation method;
a Vt implantation method;
an HDD implantation method; and
an LDD implantation method.

7. The method of claim 1, wherein at least one of the at least two gate regions has a length of approximately 5 nm to 200 nm.

8. The method of claim 1, wherein at least two of the at least two gate regions are separate from one another by a distance of approximately 5 nm to 500 nm.

9. The method of claim 1, wherein electrical contact is made with at least one of the at least two gate regions.

10. The method of claim 1, wherein
the first connection region has a first conductivity type;
the second connection region has a second conductivity type, which is opposite to the first conductivity type;
at least one first doped partial region and at least one second doped partial region are formed in the body region, wherein the at least one first doped partial region comprises the second conductivity type, and wherein the at least one second doped partial region comprises the first conductivity type; and
the at least one first doped partial region is formed between the first connection region and the at least one second doped partial region and the at least one second doped partial region is formed between the at least one first doped partial region and the second connection region in such a way that a thyristor is formed.

11. The method of claim 10, wherein
the first connection region is p-doped;
the second connection region is n-doped;
a plurality of n-doped first partial regions and a plurality of p-doped second partial regions are formed in the body region.

12. The method of claim 11, wherein, with the aid of the plurality of n-doped first partial regions, a diluted n-doped first body partial region is formed in the body region, and wherein, with the aid of the plurality of p-doped second partial regions, a diluted p-doped second body partial region is formed in the body region.

13. The method of claim 12, wherein the at least two gate regions are formed separate from one another such that at least one first gate region is formed on or above the first body partial region has a length of approximately 5 nm to 200 nm, and at least one second gate region is formed on or above the second body partial region has a length of approximately 5 nm to 200 nm.

14. The method of claim 10, wherein two adjacent gate regions comprise a distance of approximately 5 nm to 500 nm.

15. The method of claim 1, wherein
the first connection region, the second connection region and the at least one doped partial region have the same conductivity type;
with the aid of the at least one doped partial region, a diluted doped first body partial region is formed in the body region, wherein the first body partial region serves as an extended drain region; and
the first body partial region is formed such that a second body partial region is formed between the first body partial region and the second connection region, wherein the second body partial region serves as a channel region, such that a drain-extended MOS field-effect transistor is formed.

16. The method of claim 15, wherein the at least two gate regions formed separate from one another are formed such that at least one gate region formed on or above the first body partial region has a length of approximately 5 nm to 200 nm.

* * * * *